United States Patent
Kakehata et al.

(10) Patent No.: US 8,884,371 B2
(45) Date of Patent: *Nov. 11, 2014

(54) SOI SUBSTRATE AND MANUFACTURING METHOD THEREOF

(71) Applicant: Semiconductor Energy Laboratory Co., Ltd., Atsugi (JP)

(72) Inventors: Tetsuya Kakehata, Isehara (JP); Hideto Ohnuma, Atsugi (JP); Yoshiaki Yamamoto, Adachi (JP); Kenichiro Makino, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/134,047

(22) Filed: Dec. 19, 2013

(65) Prior Publication Data

US 2014/0103409 A1   Apr. 17, 2014

Related U.S. Application Data

(60) Continuation of application No. 13/230,086, filed on Sep. 12, 2011, now Pat. No. 8,633,542, which is a division of application No. 12/497,720, filed on Jul. 6, 2009, now Pat. No. 8,030,169.

(30) Foreign Application Priority Data

Jul. 8, 2008 (JP) ................................. 2008-178027

(51) Int. Cl.
| | |
|---|---|
| H01L 27/12 | (2006.01) |
| H01L 29/02 | (2006.01) |
| H01L 29/786 | (2006.01) |
| H01L 31/0352 | (2006.01) |
| H01L 29/06 | (2006.01) |
| H01L 29/78 | (2006.01) |
| H01L 21/762 | (2006.01) |
| H01L 29/66 | (2006.01) |

(52) U.S. Cl.
CPC ...... *H01L 29/0649* (2013.01); *H01L 29/78603* (2013.01); *H01L 27/1266* (2013.01); *H01L 31/0352* (2013.01); *H01L 27/1214* (2013.01); *H01L 29/78* (2013.01); *H01L 21/76254* (2013.01); *H01L 29/66772* (2013.01)
USPC .......................................... 257/347; 257/618

(58) Field of Classification Search
USPC .......................................... 257/347; 438/151
See application file for complete search history.

(56) References Cited

U.S. PATENT DOCUMENTS

| | | | |
|---|---|---|---|
| 5,371,037 | A | 12/1994 | Yonehara |
| 5,374,564 | A | 12/1994 | Bruel |

(Continued)

FOREIGN PATENT DOCUMENTS

| | | |
|---|---|---|
| EP | 0 663 688 A | 7/1995 |
| JP | 02-054532 | 2/1990 |

(Continued)

*Primary Examiner* — Evan Pert
(74) *Attorney, Agent, or Firm* — Eric J. Robinson; Robinson Intellectual Property Law Office, P.C.

(57) ABSTRACT

An object is to provide an SOI substrate provided with a semiconductor layer which can be used practically even when a glass substrate is used as a base substrate. Another object is to provide a semiconductor device having high reliability using such an SOI substrate. An altered layer is formed on at least one surface of a glass substrate used as a base substrate of an SOI substrate to form the SOI substrate. The altered layer is formed on at least the one surface of the glass substrate by cleaning the glass substrate with solution including hydrochloric acid, sulfuric acid or nitric acid. The altered layer has a higher proportion of silicon oxide in its composition and a lower density than the glass substrate.

12 Claims, 18 Drawing Sheets

(56) References Cited

U.S. PATENT DOCUMENTS

| | | | |
|---|---|---|---|
| 5,492,843 | A | 2/1996 | Adachi et al. |
| 5,517,047 | A | 5/1996 | Linn et al. |
| 5,695,557 | A | 12/1997 | Yamagata et al. |
| 5,837,619 | A | 11/1998 | Adachi et al. |
| 5,876,497 | A | 3/1999 | Atoji |
| 5,980,633 | A | 11/1999 | Yamagata et al. |
| 6,008,076 | A | 12/1999 | Codama et al. |
| 6,103,009 | A | 8/2000 | Atoji |
| 6,127,702 | A | 10/2000 | Yamazaki et al. |
| 6,271,101 | B1 | 8/2001 | Fukunaga |
| 6,313,014 | B1 | 11/2001 | Sakaguchi et al. |
| 6,335,231 | B1 | 1/2002 | Yamazaki et al. |
| 6,380,046 | B1 | 4/2002 | Yamazaki |
| 6,388,652 | B1 | 5/2002 | Yamazaki et al. |
| 6,465,381 | B1 | 10/2002 | Lautenschlager et al. |
| 6,479,334 | B1 | 11/2002 | Codama et al. |
| 6,583,440 | B2 | 6/2003 | Yasukawa |
| 6,602,761 | B2 | 8/2003 | Fukunaga |
| 6,633,061 | B2 | 10/2003 | Lutzen et al. |
| 6,686,623 | B2 | 2/2004 | Yamazaki |
| 6,778,164 | B2 | 8/2004 | Yamazaki et al. |
| 6,803,264 | B2 | 10/2004 | Yamazaki et al. |
| 6,818,921 | B2 | 11/2004 | Yasukawa |
| 6,875,633 | B2 | 4/2005 | Fukunaga |
| 6,908,797 | B2 | 6/2005 | Takano |
| 7,112,514 | B2 | 9/2006 | Yasukawa |
| 7,119,365 | B2 | 10/2006 | Takafuji et al. |
| 7,176,525 | B2 | 2/2007 | Fukunaga |
| 7,176,528 | B2 | 2/2007 | Couillard et al. |
| 7,192,844 | B2 | 3/2007 | Couillard et al. |
| 7,199,024 | B2 | 4/2007 | Yamazaki |
| 7,256,776 | B2 | 8/2007 | Yamazaki et al. |
| 7,399,681 | B2 | 7/2008 | Couillard et al. |
| 7,456,057 | B2 | 11/2008 | Gadkaree et al. |
| 7,473,971 | B2 | 1/2009 | Yamazaki et al. |
| 7,476,576 | B2 | 1/2009 | Yamazaki et al. |
| 7,476,940 | B2 | 1/2009 | Couillard et al. |
| 7,535,053 | B2 | 5/2009 | Yamazaki |
| 7,605,053 | B2 | 10/2009 | Couillard et al. |
| 7,635,617 | B2 | 12/2009 | Yamazaki |
| 7,645,392 | B2 | 1/2010 | Maunand Tussot et al. |
| 7,709,309 | B2 | 5/2010 | Moriwaka |
| 7,795,627 | B2 | 9/2010 | Yamazaki |
| 7,829,431 | B2 | 11/2010 | Tanaka |
| 7,838,935 | B2 | 11/2010 | Couillard et al. |
| 7,851,318 | B2 | 12/2010 | Koyama et al. |
| 7,863,155 | B2 | 1/2011 | Yamazaki et al. |
| 7,978,190 | B2 | 7/2011 | Yamazaki et al. |
| 8,633,542 | B2 * | 1/2014 | Kakehata et al. ............. 257/347 |
| 2005/0260800 | A1 | 11/2005 | Takano |
| 2007/0048968 | A1 | 3/2007 | Couillard et al. |
| 2007/0063281 | A1 | 3/2007 | Takafuji et al. |
| 2007/0108510 | A1 | 5/2007 | Fukunaga |
| 2007/0173000 | A1 | 7/2007 | Yamazaki |
| 2007/0281440 | A1 | 12/2007 | Cites et al. |
| 2008/0246109 | A1 | 10/2008 | Ohnuma et al. |

FOREIGN PATENT DOCUMENTS

| | | |
|---|---|---|
| JP | 06-333820 A | 12/1994 |
| JP | 07-066195 | 3/1995 |
| JP | 07-235651 A | 9/1995 |
| JP | 08-008438 A | 1/1996 |
| JP | 09-227170 A | 9/1997 |
| JP | 11-163363 | 6/1999 |
| JP | 2002-170942 A | 6/2002 |
| JP | 2004-087606 | 3/2004 |
| JP | 2005-251912 A | 9/2005 |
| JP | 2005-252244 A | 9/2005 |

* cited by examiner

SOI SUBSTRATE AND MANUFACTURING METHOD THEREOF

BACKGROUND OF THE INVENTION

1. Field of the Invention

The present invention relates to an SOI (silicon on insulator) substrate and a manufacturing method thereof. Further, the present invention relates to a semiconductor device formed using the SOI substrate and a manufacturing method thereof.

2. Description of the Related Art

In recent years, integrated circuits using an SOI (silicon on insulator) substrate in which a thin single crystal semiconductor layer is provided over an insulating surface instead of a bulk silicon wafer have been developed. Transistors in an integrated circuit can be formed so as to be completely separated from each other by making the most of characteristics of a thin single crystal silicon film formed over an insulating surface. Further, since the transistors can be formed as fully depleted transistors, a semiconductor integrated circuit having high added value such as high integration, high-speed driving, and low power consumption can be realized.

One of methods for manufacturing SOI substrates is a Smart Cut (registered trademark) method. By a Smart Cut method, not only an SOI substrate in which a single crystal silicon film is formed over a silicon substrate but also an SOI substrate in which a single crystal silicon film is formed over an insulating substrate such as a glass substrate can be manufactured (for example, see Patent Document 1). The outline of the method for manufacturing an SOI substrate in which a thin single crystal silicon film is formed over a glass substrate using a Smart Cut method is as follows. First, a silicon dioxide film is formed over one surface of a piece of single crystal silicon. Next, hydrogen ions are added to the piece of single crystal silicon, whereby a hydrogen-ion-introduced layer is formed at a predetermined depth of the piece of single crystal silicon. Then, the piece of single crystal silicon to which hydrogen ions are added is bonded to a glass substrate with the silicon dioxide film interposed therebetween. After that, heat treatment is performed, whereby the hydrogen-ion-introduced layer functions as a cleavage plane and then the piece of single crystal silicon to which hydrogen ions are added is thinly separated. In this manner, a thin single crystal silicon film can be formed over the glass substrate to which the piece of single crystal silicon is bonded. A Smart Cut (registered trademark) method may be referred to as a hydrogen-ion-implantation-separation method.

REFERENCE

Patent Document

[Patent Document 1] Japanese Published Patent Application No. 2004-87606.

SUMMARY OF THE INVENTION

The price per unit area of a glass substrate is low as compared with that of a silicon substrate. Therefore, by using a glass substrate as a base substrate instead of a silicon substrate, an inexpensive large-sized SOI substrate can be manufactured. However, in the manufacturing process of an SOI substrate, if a foreign material exists on any of surfaces of the glass substrate and the semiconductor substrate (the piece of single crystal silicon) when bonding of the glass substrate and the semiconductor substrate is performed, the bonding thereof is not performed at the periphery of the foreign material. Then, when heat treatment is performed at this condition and the semiconductor substrate is thinly separated, a semiconductor layer (a thin single crystal silicon film) is not formed at the periphery of the foreign material on the glass substrate, thereby generating a deficiency region in the semiconductor layer. In this manner, when an SOI substrate is manufactured using an glass substrate, there is a problem in that a foreign material is interposed between a semiconductor substrate and the glass substrate and then a deficiency region of the semiconductor layer of the SOI substrate is generated. When a semiconductor element is manufactured using the SOI substrate including the deficiency region in the semiconductor layer, the deficiency region of the semiconductor layer may cause abnormality of various characteristics of the semiconductor element. Further, in the process of manufacturing the SOI substrate using the glass substrate, the semiconductor layer and a gate insulating film are at risk of being contaminated by movable ions such as alkali metal and alkaline earth metal.

In view of the aforementioned problems, an object of an embodiment of the present invention is to provide an SOI substrate provided with a semiconductor layer which can be used practically even when a glass substrate is used for a base substrate and a manufacturing method thereof. Further, another object of the present invention is to provide a semiconductor device having high reliability using such an SOI substrate.

In an embodiment of the present invention, in order to solve the aforementioned problems, an altered layer is formed on at least one surface of the glass substrate used as the base substrate of the SOI substrate to form the SOI substrate. The altered layer is formed on the surface of the glass substrate by processing the glass substrate with a solution including hydrochloric acid, sulfuric acid or nitric acid. The altered layer has a higher proportion of silicon oxide in its composition and a lower density than the glass substrate.

An embodiment of the present invention is an SOI substrate including: a glass substrate having at least one surface on which an altered layer is formed; a first insulating layer provided over and in contact with the altered layer; and a single crystal semiconductor layer provided over and in contact with the first insulating layer, and the altered layer has a higher proportion of silicon oxide in its composition and a lower density than the glass substrate.

Another embodiment of the present invention is an SOI substrate including: a glass substrate having at least one surface on which an altered layer is formed; a nitrogen-containing layer provided over and in contact with the altered layer; a first insulating layer provided over and in contact with the nitrogen-containing layer; and a single crystal semiconductor layer provided over and in contact with the first insulating layer, and the altered layer has a higher proportion of silicon oxide in its composition and a lower density than the glass substrate.

Another embodiment of the present invention is an SOI substrate including: a glass substrate having at least one surface on which an altered layer is formed; a second insulating layer provided over and in contact with the altered layer; a nitrogen-containing layer provided over and in contact with the second insulating layer; a first insulating layer provided over and in contact with the nitrogen-containing layer; and a single crystal semiconductor layer provided over and in contact with the first insulating layer, and the altered layer has a higher proportion of silicon oxide in its composition and a lower density than the glass substrate.

Further, the concentrations of alkali metal and alkaline earth metal in the altered layer are preferably lower than those in the glass substrate. In addition, between the glass substrate and the altered layer, an intermediate layer having values of the composition and the density of the intermediate layer which are intermediate between values of the glass substrate and the altered layer may be formed.

Note that each of the first insulating layer and the second insulating layer is preferably formed using a silicon oxide film. The silicon oxide film may be formed by a chemical vapor deposition method using an organosilane gas. In addition, a chlorine atom may be included in the silicon oxide film. Further, the nitrogen-containing layer is preferably formed using a single layer or a stacked layer of a plurality of films selected from a silicon nitride film, a silicon nitride oxide film, and a silicon oxynitride film. Moreover, the glass substrate is preferably formed from aluminosilicate glass, aluminoborosilicate glass or barium borosilicate glass.

Another embodiment of the present invention is a manufacturing method of an SOI substrate which is formed as follows: a glass substrate is processed with a solution including hydrochloric acid, sulfuric acid or nitric acid to form an altered layer on at least one surface of the glass substrate; a single crystal semiconductor substrate is bonded to the altered layer with a first insulating layer interposed therebetween; part of the single crystal semiconductor substrate is separated to form a single crystal semiconductor layer over the glass substrate.

Another embodiment of the present invention is a manufacturing method of an SOI substrate which is formed as follows: a glass substrate is processed with a solution including hydrochloric acid, sulfuric acid or nitric acid; an altered layer is formed on at least one surface of the glass substrate; a single crystal semiconductor substrate is bonded to the altered layer with a nitrogen-containing layer and a first insulating layer interposed therebetween; and part of the single crystal semiconductor substrate is separated to form a single crystal semiconductor layer over the glass substrate.

Another embodiment of the present invention is a manufacturing method of an SOI substrate which is formed as follows: a glass substrate is processed with a solution including chlorine, sulfuric acid or nitric acid; an altered layer is formed on at least one surface of the glass substrate; a single crystal semiconductor substrate is bonded to the altered layer with a second insulating layer, a nitrogen-containing layer and a first insulating layer interposed therebetween; and part of the single crystal semiconductor substrate is separated to form a single crystal semiconductor layer over the glass substrate.

Note that a hydrochloric acid/hydrogen peroxide solution mixture which is formed by mixing hydrochloric acid, hydrogen peroxide solution and pure water is preferably used as the solution including hydrochloric acid, sulfuric acid or nitric acid. In addition, ultrasonic oscillation is preferably applied to the solution including hydrochloric acid, sulfuric acid or nitric acid in the above treatment.

Note that in this specification, the altered layer is formed on at least one surface of a glass substrate and has a higher proportion of silicon oxide in its composition and a lower density than the glass substrate. The proportion of the silicon oxide is judged by a peak and a chemical shift of a photoelectron spectrum measured with the use of X-ray photoelectron spectroscopy (XPS). Further, the density is judged by checking results from X-ray reflectivity (XRR) measurement with simulation results.

Note that a semiconductor device in this specification generally indicates a device capable of functioning by utilizing semiconductor characteristics, and electro-optical devices, semiconductor circuits, and electronic apparatuses are all semiconductor devices.

In addition, in this specification, a display device includes a light-emitting device and a liquid crystal display device. The light-emitting device includes a light-emitting element, and the liquid crystal display device includes a liquid crystal element. The light-emitting element includes, in its category, an element whose luminance is controlled by current or a voltage, and specifically includes an inorganic electroluminescent (EL) element, an organic EL element, and the like.

According to an embodiment of the present invention, an SOI substrate provided with the semiconductor layer which can be used practically can be provided even when a glass substrate is used as a base substrate.

Figure 1A:
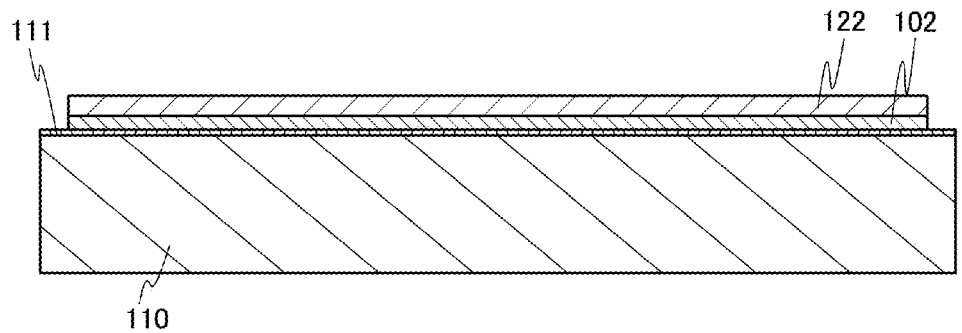
FIGS. 1A to 1C each illustrate an SOI substrate according to an embodiment of the present invention.

Hereinafter, embodiments and examples of the present invention will be described with reference to the drawings. However, the present invention can be implemented in various different modes, and it is to be easily understood that various changes and modifications in modes and details thereof will be apparent to those skilled in the art without departing from the meaning and the scope of the present invention. Therefore, this invention should not be interpreted as being limited to the description of the embodiments. Through the drawings for illustrating embodiments, like components are denoted by like reference numerals and repetitive description thereof is not made.

Embodiment 1

In this embodiment, structures of an SOI substrate according to the present invention is described with reference to FIGS. 1A to 1C.

FIG. 1A illustrates an SOI substrate having a structure in which an insulating layer 102 is formed over a glass substrate 110 having one surface provided with an altered layer 111 and a semiconductor layer 122 is formed over the insulating layer 102. Here, as the glass substrate 110, a glass substrate selected from a variety of glass substrates that are used in the electronics industry is preferably used, such as a substrate of aluminosilicate glass, aluminoborosilicate glass, or barium borosilicate glass. Further, as the glass substrate 110, a glass substrate having any of the following size can be used: 3rd generation (550 mm×650 mm); 3.5th generation (600 mm×720 mm or 620 mm×750 mm); 4th generation (680×880 mm or 730 mm×920 mm); 5th generation (1100 mm×1300 mm); 6th generation (1500 mm×1850 mm); 7th generation (1870 mm×2200 mm); 8th generation (2200×2400 mm); 9th generation (2400 mm×2800 mm or 2450 mm×3050 mm); and 10th generation (2850 mm×3050 mm or 2950 mm×3400 mm).

The altered layer 111 is formed on the one surface of the glass substrate 110. Here, the altered layer 111 is formed on at least the one surface of the glass substrate 110 and has a higher proportion of silicon oxide in its composition and a lower density than the glass substrate 110. In addition, the altered layer 111 has lower concentrations of alkali metal, alkaline earth metal and metal than the glass substrate 110. Here, the proportion of the silicon oxide is judged by a peak and a chemical shift of a photoelectron spectrum measured with the use of X-ray photoelectron spectroscopy (XPS). Further, the density is judged by checking results from X-ray reflectivity (XRR) measurement with simulation results. As for the composition of the altered layer 111, silicon and oxygen preferably account for higher than or equal to 90%, more preferably higher than or equal to 99% in the case of the measurement with the use of XPS. Metal such as aluminum and calcium; boron; and alkaline earth metal such as strontium and magnesium preferably account for lower than or equal to 10%, more preferably lower than or equal to 1%. Moreover, the thickness of the altered layer 111 is preferably greater than or equal to 5 nm and less than or equal to 3 μm. The altered layer 111 having such a thickness is preferable because the thickness of the altered layer 111 and the diameter of a foreign material become almost the same. Further, the density of the altered layer 111 is preferably greater than or equal to 1.5 g/cm$^3$ and less than or equal to 2.5 g/cm$^3$, in particular, greater than or equal to 1.8 g/cm$^3$ and less than or equal to 2.3 g/cm$^3$. The altered layer 111 is preferably formed by processing the glass substrate 110 with the use of a solution including hydrochloric acid, sulfuric acid or nitric acid. In particular, the altered layer 111 is preferably formed by processing the glass substrate 110 with the use of a hydrochloric acid/hydrogen peroxide solution mixture (HPM) which is a mixed solution of hydrochloric acid, a hydrogen peroxide solution and pure water. Note that the altered layer 111 is not necessarily formed on only the one surface of the glass substrate 110; for example, the altered layer 111 may be formed on the entire surface of the glass substrate 110.

In addition, an intermediate layer having values of the composition and the density which are intermediate between values of the glass substrate 110 and the altered layer 111 may exist between the glass substrate 110 and the altered layer 111.

Typically, single crystal silicon is applied to the semiconductor layer 122. Alternatively, silicon which can be separated from a polycrystalline semiconductor substrate by a hydrogen-ion-implantation-separation method or germanium which can be separated from a single crystal semiconductor substrate or a polycrystalline semiconductor substrate by a hydrogen-ion-implantation-separation method can be used. Still alternatively, a crystalline semiconductor substrate of a compound semiconductor such as silicon germanium, gallium arsenide, or indium phosphide can be used.

The insulating layer 102 is provided between the altered layer 111 and the semiconductor layer 122. As the insulating layer 102, a smooth insulating layer having a hydrophilic surface is preferable and a silicon oxide film is suitable. In particular, a silicon oxide film formed by a chemical vapor deposition method using an organosilane gas is preferable. Examples of the organosilane gas include silicon-containing compounds such as tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$). Note that a silicon oxynitride film may be used as the insulating layer 102 instead of a silicon oxide film.

Further, an oxide film formed by thermally oxidizing the semiconductor layer 122 may be used as the insulating layer 102. In addition, by inclusion of a chlorine atom in the oxide film, reduction of the interface state of the insulating layer 102 and quality improvement of the oxide film can be realized. Furthermore, the oxide film which is formed by thermal oxidation is suitable for an insulating film of the SOI substrate because the number of particles in or on the oxide film is remarkably small. Further, by inclusion of a chlorine atom in the oxide film, a heavy metal which is an extrinsic impurity is captured so as to prevent contamination of the semiconductor layer. As the insulating layer 102, chemical oxide can also be used. Chemical oxide can be formed by, for example, treatment of a surface of a semiconductor substrate that is to become an SOI layer with ozone-containing water. Since chemical oxide reflects the shape of the surface of the semiconductor substrate, it is preferable that the semiconductor substrate be flat so that the chemical oxide also becomes flat.

The insulating layer 102 is formed to a thickness of greater than or equal to 5 nm and less than or equal to 500 nm. With this thickness, it is possible to smooth the surface roughness of a surface of the insulating layer 102 (a surface on which bonding is performed) and also to ensure smoothness of a growth surface of the layer. Further, by provision of the insulating layer 102, thermal distortion of the glass substrate 110 and the semiconductor layer 122 can be relieved. In other words, when the glass substrate 110 is bonded to the semiconductor layer 122, the insulating layer 102 is provided over the surface of the semiconductor layer 122 on which bonding is performed, whereby the glass substrate 110 and the semiconductor layer 122 can be bonded strongly.

Figure 1B:
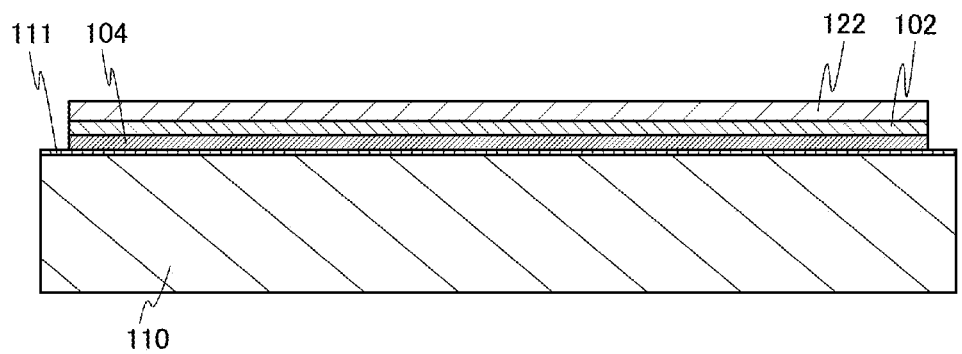

FIG. 1B illustrates an SOI substrate having a structure in which a nitrogen-containing layer 104, the insulating layer 102 and the semiconductor layer 122 are provided over the glass substrate 110 having the one surface on which the altered layer 111 is formed. That is, FIG. 1B illustrates the SOI substrate having a structure in which the nitrogen-containing layer 104 is added between the altered layer 111 and the insulating layer 102 of the structure in FIG. 1A. Here, the nitrogen-containing layer 104 is a film containing at least nitrogen and silicon. Provision of the nitrogen-containing layer 104 between the altered layer 111 and the insulating layer 102 prevents the semiconductor layer 122 from being contaminated by impurities diffused from the glass substrate 110 such as movable ions of, for example, alkali metal or alkaline earth metal, moisture or the like. The nitrogen-containing layer 104 is preferably formed using a single layer or a stacked layer of a plurality of films selected from a silicon nitride film, a silicon nitride oxide film, and a silicon oxynitride film.

Note that a silicon oxynitride film refers to a film which contains more oxygen than nitrogen and, in the case where measurements are performed using Rutherford backscattering spectrometry (RBS) and hydrogen forward scattering (HFS), contains oxygen, nitrogen, silicon, and hydrogen at concentrations of greater than or equal to 50 and less than or equal to 70 at. %, greater than or equal to 0.5 and less than or equal to 15 at. %, greater than or equal to 25 and less than or equal to 35 at. %, and greater than or equal to 0.1 and less than or equal to 10 at. %, respectively. Further, a silicon nitride oxide film refers to a film that contains more nitrogen than oxygen and, in the case where measurements are performed using RBS and HFS, contains oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Figure 1C:
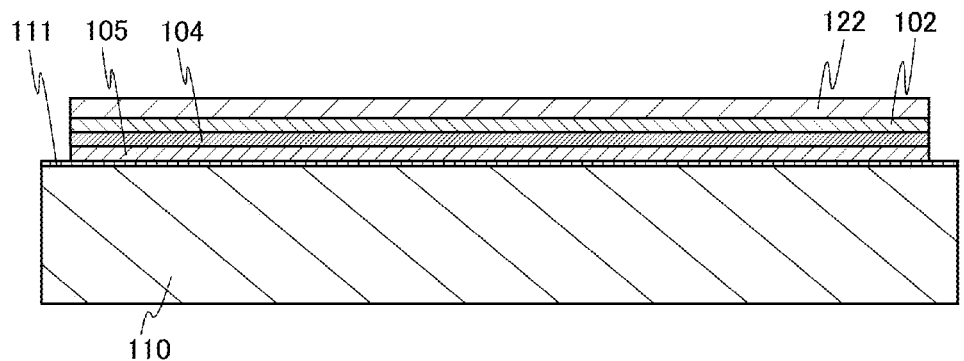

FIG. 1C illustrates the SOI substrate having a structure in which an insulating layer 105, the nitrogen-containing layer 104, the insulating layer 102 and the semiconductor layer 122 are provided over the glass substrate 110 having the one surface on which the altered layer 111 is formed. That is, FIG. 1C illustrates the SOI substrate having a structure in which the insulating layer 105 is added between the altered layer 111 and the nitrogen-containing layer 104 of the structure in FIG. 1B. The insulating layer 105 preferably has a smooth insulating layer having a hydrophilic surface, and a silicon oxide film is suitable. In particular, a silicon oxide film formed by a chemical vapor deposition method using an organosilane gas is preferable. Examples of an organosilane gas include silicon-containing compounds such as tetraethoxysilane (TEOS) (chemical formula: $Si(OC_2H_5)_4$), tetramethylsilane (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

In this embodiment, since the altered layer 111 formed on at least the one surface of the glass substrate 110 has a high proportion of silicon oxide and a large amount of silicon oxide appears on the surface of the altered layer 111 as compared to the glass substrate 110, a strong covalent bond is likely to be formed in a bonding interface between the altered layer 111 and the insulating layer 102, the nitrogen-containing layer 104 or the insulating layer 105. Further, since the altered layer 111 has a low density as compared to the glass substrate 110, the Young's modulus of the altered layer 111 is small and therefore, the altered layer 111 is easily deformed. Accordingly, when the insulating layer 102, the nitrogen-containing layer 104 or the insulating layer 105 is bonded to the altered layer 111, even when a foreign material exists on the surface of either the insulating layer 102, the nitrogen-containing layer 104 or the insulating layer 105, unevenness generated due to the foreign material can be reduced since the altered layer 111 is deformed. As compared to the case of bonding with the glass substrate 110 not provided with the altered layer 111, a region in a periphery of the foreign material, in which bond is not formed, is reduced and the number of the regions is also reduced. Therefore, as compared to the case where the insulating layer 102, the nitrogen-containing layer 104 or the insulating layer 105 is bonded to the glass substrate 110, a deficiency region of the semiconductor layer 122 of this embodiment is reduced and the number of the deficiency regions is also reduced. In particular, it is preferable that the thickness of the altered layer 111 be greater than or equal to 5 nm and less than or equal to 3 μm because the thickness of the altered layer 111 and the diameter of the foreign material are almost the same in this case.

Figure 2A:
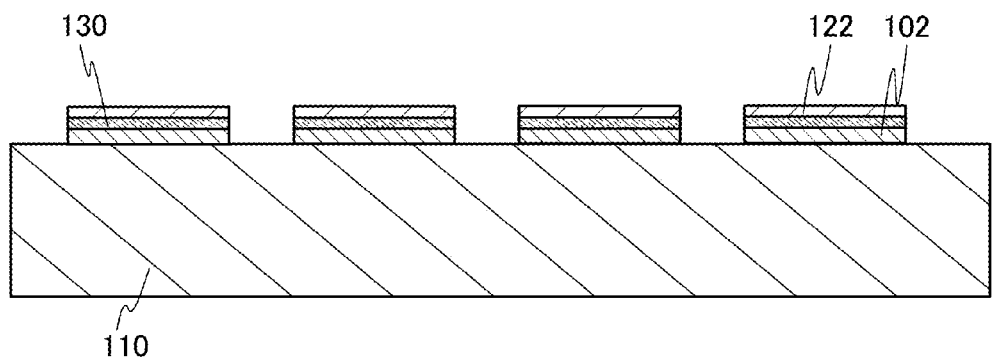
FIGS. 2A and 2B each illustrate an SOI substrate according to an embodiment of the present invention.
Figure 2B:
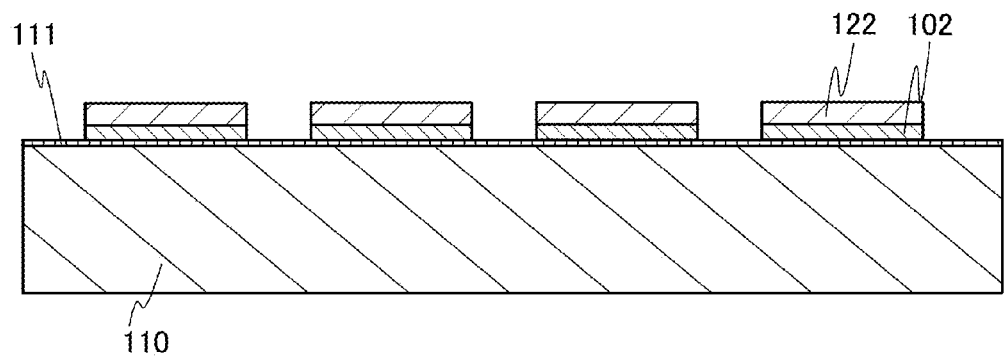

Further, in the altered layer 111, impurities such as movable ions of alkali metal and alkaline earth metal which contaminate the semiconductor layer are reduced and thus contamination of the semiconductor layer 122 can be reduced. In the SOI substrate having the structure of FIG. 1A, the nitrogen-containing layer 104 functioning as a blocking layer does not exist; therefore, the altered layer 111 is particularly effective. In the case where the plurality of semiconductor layers 122 is bonded to the large glass substrate 110 without the layer functioning as a blocking layer, as illustrated in FIG. 2A, a contaminated region 130 contaminated by impurities such as movable ions of alkali metal and alkaline earth metal is formed in the semiconductor layer 122. In contrast, as illustrated in FIG. 2B, in the case where the plurality of semiconductor layers 122 is bonded to the large glass substrate 110 having one surface on which the altered layer 111 is formed, the semiconductor layer 122 is prevented from being contaminated by impurities such as movable ions of alkali metal and alkaline earth metal. Further, in a process through which a semiconductor device such as a thin film transistor is formed using this SOI substrate, the semiconductor layer 122 and a gate insulating film formed over the semiconductor layer are prevented from being contaminated by impurities such as movable ions of alkali metal and alkaline earth metal.

In this manner, although a glass substrate is used as a base substrate of an SOI substrate, the deficiency region of the semiconductor layer can be reduced and thus the SOI substrate provided with the semiconductor layer which can be used practically can be provided.

Embodiment 2

In this embodiment, a method for manufacturing an SOI substrate according to the present invention is described with reference to FIGS. 3A and 3B, FIGS. 4A and 4B, FIGS. 5A to 5D and FIGS. 6A and 6B.

First, a glass substrate 110 is processed with the use of a solution 123 including hydrochloric acid, sulfuric acid or nitric acid. Here, the same glass substrate as the glass substrate described in Embodiment 1 is used for the glass substrate 110. The treatment is not necessarily performed on the entire surface of the glass substrate 110 and may be performed so that at least a surface which is to be bonded to the semiconductor layer 122 is processed. As the solution 123, for example, a hydrochloric acid/hydrogen peroxide solution mixture (HPM), which is a mixed solution of hydrochloric acid, a hydrogen peroxide solution and pure water, or a sulfuric acid/hydrogen peroxide mixture (SPM), which is a mixed solution of sulfuric acid and a hydrogen peroxide solution, is used. Preferably, a hydrochloric acid/hydrogen peroxide solution mixture (HPM), which is a mixed solution of hydrochloric acid, a hydrogen peroxide solution and pure water, is used. More preferably, when the treatment is performed using HPM, the temperature of the mixed solution is raised to higher than or equal to 70° C. and lower than or equal to 90° C.; when the treatment is performed using SPM, the temperature of the mixed solution is raised to higher than or equal to 80° C. and lower than or equal to 120° C. Further, when the solution 123 is processed while ultrasonic waves are applied thereto, the rest of abrasive (slurry) typified by cerium oxide and particles can be removed and reattachment thereof can be prevented. Further, after the treatment with the solution 123, cleaning with pure water is preferably performed. Then, water droplets existing on the glass substrate 110 are preferably dried. By cleaning with pure water, the solution 123 attached to the glass substrate 110 can be removed.

Figure 3A:
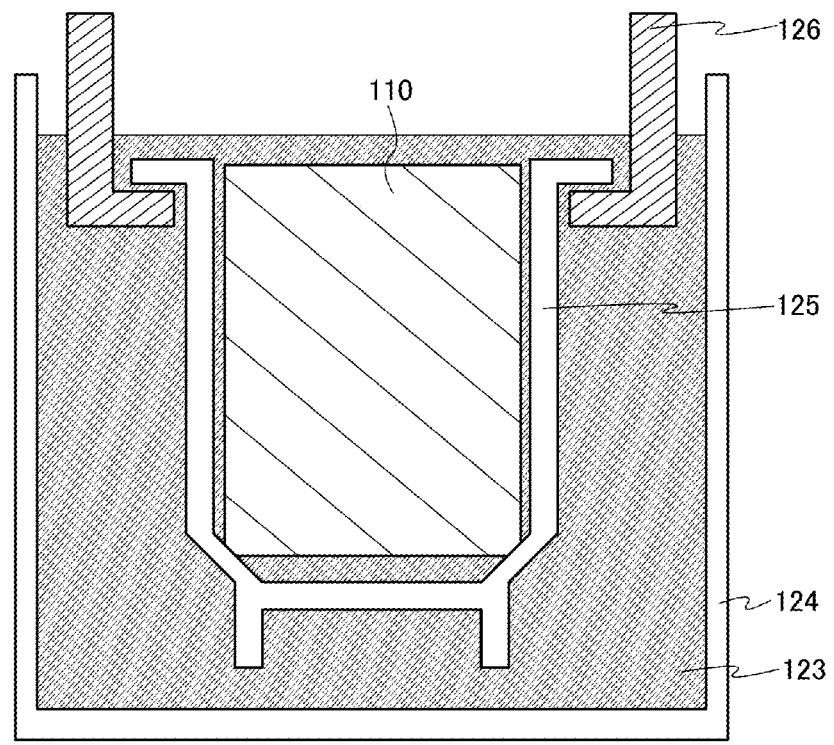
FIGS. 3A and 3B illustrate methods for manufacturing an SOI substrate according to an embodiment of the present invention.

For example, the glass substrate 110 can be processed with the use of a batch-type cleaning machine (see FIG. 3A). In the batch-type cleaning machine, the treatment of the glass substrate 110 is performed as follows. The glass substrate 110 is set in a carrier 125 fixed by a transport chuck 126 and the carrier 125 holding the glass substrate 110 is soaked in a cleaning bath 124 filled with the solution 123. At this time, the glass substrate 110 is preferably soaked in the solution 123 for approximately 10 minutes. Further, by using an ultrasonic cleaning bath as the cleaning bath 124, ultrasonic cleaning can be performed with the use of the solution 123 to which ultrasonic oscillation having a frequency of greater than or equal to 15 kHz and less than or equal to 1 MHz, preferably greater than or equal to 30 kHz and less than or equal to 50 kHz is applied. Further, when a plurality of glass substrates 110 is set in the carrier 125, the plurality of glass substrates 110 can be processed together by one treatment. Further, after the treatment with the solution 123, it is preferable that the glass substrate 110 is soaked in a cleaning bath filled with pure water for approximately 10 minutes and then dried with a rinser dryer so that water droplets existing on the glass substrate 110 are dried.

Figure 3B:
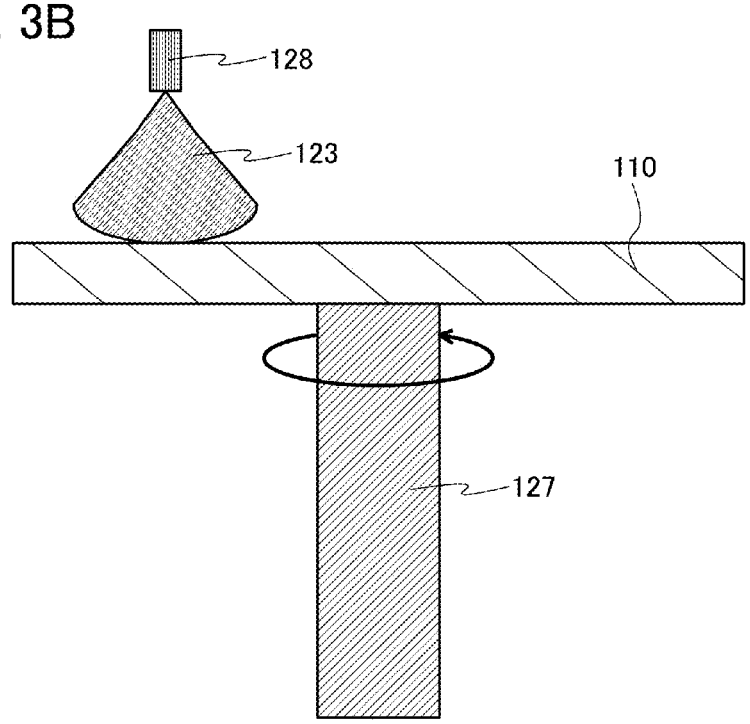

Further, the glass substrate 110 can also be processed with the use of a single wafer cleaning machine (see FIG. 3B). In the single wafer cleaning machine, the glass substrate 110 is processed as follows. The glass substrate 110 is fixed to a mandrel 127 so as to be rotated and then the solution 123 is supplied from a cleaning nozzle 128 on the surface side. Further, megahertz ultrasonic cleaning (megasonic cleaning) can be performed by using a cleaning nozzle which vibrates the solution 123 with the use of ultrasonic waves (megahertz ultrasonic waves) having a frequency of greater than or equal to 700 kHz and less than or equal to 2 MHz, preferably greater than or equal to 800 kHz and less than or equal to 1 MHz as the cleaning nozzle 128. In addition, the cleaning nozzle 128 may be provided not only on the surface side but also on a rear surface side of the glass substrate 110. Further, megasonic cleaning may be performed using a nozzle capable of supplying pure water to which an ultrasonic oscillation having a frequency of greater than or equal to 700 kHz and less than or equal to 2 MHz, preferably greater than or equal to 800 kHz and less than or equal to 1 MHz is applied in addition to the cleaning nozzle 128 supplying the solution 123. Further, after the treatment with the solution 123, it is preferable that the glass substrate 110 is cleaned with the use of the nozzle capable of supplying pure water and dried with a rinser dryer so that water droplets existing on the glass substrate 110 are dried.

Figure 4A:
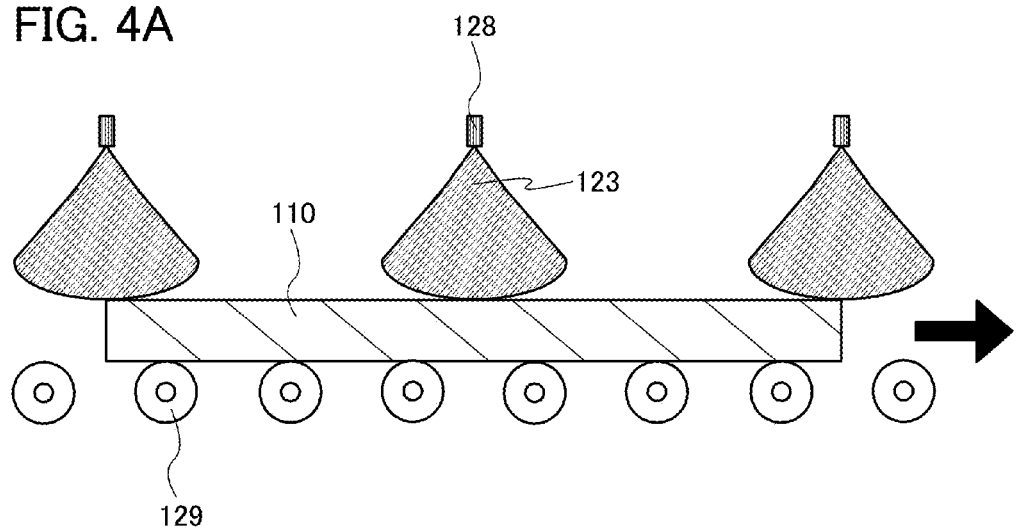
FIGS. 4A and 4B illustrate a method for manufacturing an SOI substrate according to an embodiment of the present invention.
Figure 4B:
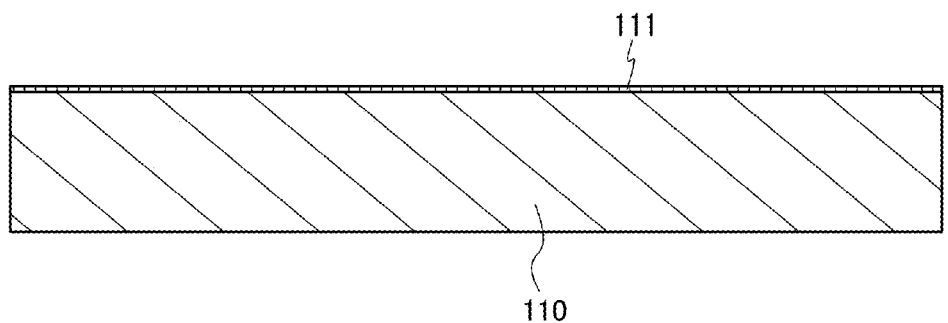

Alternatively, the glass substrate 110 can be disposed over a transport roller 129, whereby the glass substrate 110 may be processed while being transported (see FIG. 4A). The solution 123 is supplied to the glass substrate 110 is from the cleaning nozzle 128 over the glass substrate 110 while the glass substrate 110 is transported by the transport roller 129. Further, megasonic cleaning can be performed by using a cleaning nozzle which vibrates the solution 123 with the use of ultrasonic waves having a frequency of greater than or equal to 700 kHz and less than or equal to 2 MHz, preferably greater than or equal to 800 kHz and less than or equal to 1 MHz as the cleaning nozzle 128. Further, use of the transport roller 129 facilitates treatment of a large-sized glass substrate. In addition, after the treatment with the solution 123, it is preferable that the glass substrate 110 is cleaned with the use of the nozzle capable of supplying pure water and dried with a rinser dryer so that water droplets existing on the glass substrate 110 are dried.

By the treatment described above, ions of alkali metal, alkaline earth metal and metal are eluted from at least one surface of the glass substrate 110. Accordingly, the altered layer 111 which has a higher proportion of silicon oxide in its composition and a lower density than the glass substrate 110 is formed on at least the one surface of the glass substrate 110 (see FIG. 4B). In addition, liftoff and removal of particles and the like over the glass substrate 110 are performed at the same time as the elution of metal. As for the composition of the altered layer 111, silicon and oxygen preferably account for higher than or equal to 90%; more preferably higher than or equal to than 99% in the case of the measurement with the use of X-ray photoelectron spectroscopy (XPS). Metal, such as aluminum and calcium; boron; and alkaline earth metal, such as strontium and magnesium preferably account for lower than or equal 10%; more preferably, lower than or equal to 1%. Moreover, the thickness of the altered layer 111 is preferably greater than or equal to 5 nm and less than or equal to 3 p.m. Further, the density of the altered layer 111 is preferably greater than or equal to 1.5 g/cm$^3$ and less than or equal to 2.5 g/cm$^3$; in particular, preferably greater than or equal to 1.8 g/cm$^3$ and less than or equal to 2.3 g/cm$^3$. Note that the altered layer 111 is formed on only the one surface of the glass substrate 110 in FIG. 4B; however, the present invention is not limited thereto. For example, the altered layer 111 may be formed over the entire surface of the glass substrate 110.

As the glass substrate 110, a large-sized mother glass substrate referred to as the 6th generation (1500 mm×1850 mm), the 7th generation (1870 mm×2200 mm), the 8th generation (2200 mm×2400 mm), the 9th generation (2400 mm×2800 mm or 2450 mm×3050 mm), or the 10th generation (2850 mm×3050 or 2950 mm×3400 mm) can be used. A large-sized mother glass substrate is used as the glass substrate 110 and the glass substrate is bonded to a plurality of semiconductor substrates to manufacture an SOI substrate, whereby the SOI substrate can have a larger size. Thus, the number of display panels which can be manufactured from a single substrate (panels yielded per substrate) can be increased, and accordingly, productivity can be improved.

Figure 5A:
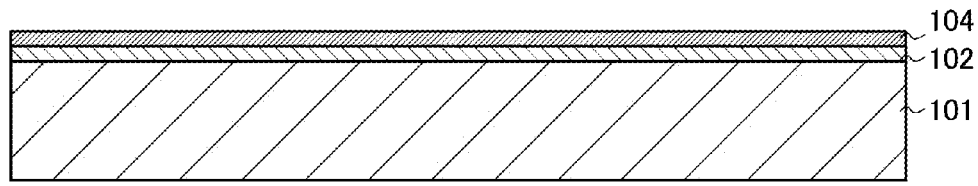
FIGS. 5A to 5D illustrate a method for manufacturing an SOI substrate according to an embodiment of the present invention.

Next, a semiconductor substrate 101 is prepared, and the insulating layer 102 and the nitrogen-containing layer 104 are formed over a surface of the semiconductor substrate 101 (see FIG. 5A).

As the semiconductor substrate 101, a commercial semiconductor substrate can be used; typically, a single crystal silicon substrate is used. Alternatively, silicon which can be separated from a polycrystalline semiconductor substrate by a hydrogen-ion-implantation-separation method or germanium which can be separated from a single crystal semiconductor substrate or a polycrystalline semiconductor substrate by a hydrogen-ion-implantation-separation method can be used. Still alternatively, a crystalline semiconductor substrate of a compound semiconductor such as silicon germanium, gallium arsenide, or indium phosphide can also be used. As the commercial single crystal silicon substrate, typically, a circular substrate which is 5 inches in diameter (125 mm), 6 inches in diameter (150 mm), 8 inches in diameter (200 mm), and 12 inches in diameter (300 mm). Note that the shape of the single crystal silicon substrate is not limited to a circular shape, and a single crystal silicon substrate processed into a rectangular shape or the like can also be used.

An insulating layer having a smooth surface is preferably used as the insulating layer 102, and a silicon oxide film is suitable. Further, the insulating layer 102 is preferably deposited to a thickness of greater than or equal to 5 nm and less than or equal to 500 nm.

In particular, a silicon oxide film which is deposited by a chemical vapor deposition method using an organosilane gas is preferable. This is because the insulating layer 102 can have a flat surface by using the silicon oxide film formed using an organosilane gas.

Examples of the organosilane gas include silicon-containing compounds such as tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

Here, a silicon oxide film which is deposited by a chemical vapor deposition method using organosilane as a source gas is formed over the semiconductor substrate 101. Alternatively, a silicon oxide film or a silicon oxynitride film which is deposited by a chemical vapor deposition method using a silane as a source gas can be used.

Alternatively, as the insulating layer 102, an oxide film formed by thermally oxidizing the semiconductor substrate 101 may be used. In addition, thermal oxidation treatment may be performed on the semiconductor substrate 101 in an oxidation atmosphere to which chlorine is added, whereby a chlorine atom may be included in the oxide film. By inclusion of a chlorine atom in the insulating layer 102, reduction of the interface state of the insulating layer 102 and quality improvement of the oxide film can be realized. Further, by inclusion of a chlorine atom in the insulating layer 102, a heavy metal which is an extrinsic impurity is captured so as to prevent contamination of the semiconductor layer. As the insulating layer 102, chemical oxide can also be used. Chemical oxide can be formed by, for example, treatment of a surface of a semiconductor substrate that is to become an SOI layer with ozone-containing water. Since the chemical oxide reflects the shape of the surface of the semiconductor substrate, it is preferable that the semiconductor substrate be flat so that the chemical oxide also becomes flat.

And then, the nitrogen-containing layer 104 is formed over the insulating layer 102. When part of the semiconductor substrate 101 is bonded to the glass substrate to form the semiconductor layer 122, the nitrogen-containing layer 104 also functions as a barrier layer for preventing impurities such as movable ions of alkali metal, alkaline earth metal, moisture and the like included in the glass substrate 110 from being diffused to the semiconductor layer 122.

The nitrogen-containing layer 104 is a film which at least includes nitrogen and silicon. For example, the nitrogen-containing layer 104 is deposited so as to have a single layer structure or a stacked layer structure which includes any of a silicon nitride film, a silicon nitride oxide film, or a silicon oxynitride film by a CVD method or the like. The nitrogen-containing layer 104 is formed in the range of greater than or equal to 10 nm and less than or equal to 200 nm; preferably in the range of greater than or equal to 50 nm and less than or equal to 100 nm.

For example, a silicon nitride oxide film which is deposited by a plasma CVD method at a low temperature (higher than or equal to 100° C. and lower than or equal to 350° C., preferably higher than or equal to 150° C. and lower than or equal to 300° C.) is suitable for the nitrogen-containing layer 104. A silicon nitride oxide film having a smooth surface can be obtained by depositing by a plasma CVD method at a low temperature. In addition, the deposition at a low temperature can prevent an embrittlement layer 103 formed in the semiconductor substrate 101 from being degassed. Note that a heat treatment temperature for separating the semiconductor layer 122 from the semiconductor substrate 101 is higher than the deposition temperature of the nitrogen-containing layer.

In this embodiment, the silicon oxide film having a smooth surface is provided as the insulating layer 102, thereby flattening a surface of the nitrogen-containing layer 104 which is formed over the insulating layer 102. Note that in the case where the semiconductor substrate 101 has a flat surface, a structure in which the insulating layer 102 is not provided may be employed. For example, the nitrogen-containing layer 104 can be formed of a single layer selected from a silicon oxynitride film or a silicon nitride oxide film, or can be formed of a stack of a silicon oxynitride film and a silicon nitride oxide film which are stacked in this order from the semiconductor substrate 101 side.

Figure 5B:
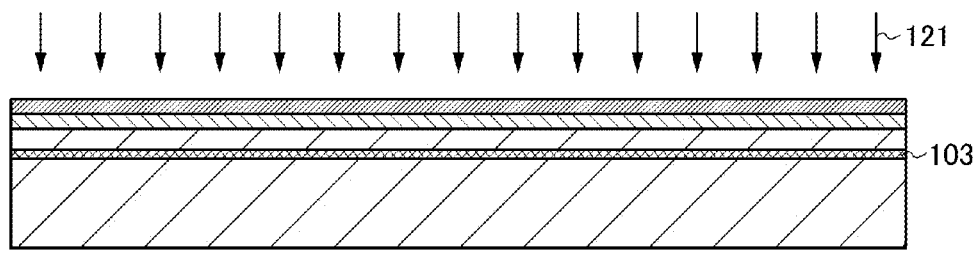

Next, the semiconductor substrate 101 is irradiated with an ion beam 121 including ions accelerated by an electric field through the insulating layer 102 and the nitrogen-containing layer 104, whereby the embrittlement layer 103 is formed in a region at a predetermined depth from the surface of the semiconductor substrate 101 (see FIG. 5B). The ion beam 121 is generated in such a manner that a source gas is excited, plasma of the source gas is generated, and ions included in the plasma are extracted from the plasma by the action of an electric field.

The depth at which the embrittlement layer 103 is formed can be adjusted by the acceleration energy of the ion beam 121 and the angle at which the ion beam 121 enters. The acceleration energy can be adjusted by an acceleration voltage, dosage, or the like. The embrittlement layer 103 is formed at the same depth or substantially the same depth as the average depth at which the ions have entered. The thickness of the semiconductor layer 122 which is to be separated from the semiconductor substrate 101 is determined in accordance with the depth at which the ions are added. The depth at which the embrittlement layer 103 is formed is greater than or equal to 10 nm and less than or equal to 500 nm from the surface of the semiconductor substrate 101; preferably, greater than or equal to 50 nm and less than or equal to 200 nm from the surface of the semiconductor layer 101.

In order to add ions to the semiconductor substrate 101, an ion-implantation method in which mass separation is performed may be employed, or an ion-doping method in which mass separation is not performed may be employed.

In the case of using hydrogen ($H_2$) for the source gas, the hydrogen gas can be excited to generate plasma including $H^+$, $H_2^+$, and $H_3^+$. The proportion of ion species generated from the source gas can be changed by adjusting a plasma-excitation method, pressure in an atmosphere for generating plasma, the amount of a source gas supplied, and the like. With respect to the total amount of $H+$, $H_2+$, and $H_3+$ included in the ion beam 121, $H_3^+$ is preferably included in the ion beam 121 at greater than or equal to 50%, and further preferably at greater than or equal to 80%.

$H_3^+$ ions includes more hydrogen atoms than other hydrogen ion species ($H^+$ ions and $H_2^+$ ions), and as a result, the mass of $H_3^+$ ions is large. Thus, in the case where $H^+$ ions, $H_2^+$ ions, and $H_3^+$ ions are accelerated by the same energy, $H_3^+$ ions are added to a region shallower than regions in the semiconductor substrate 101 where $H^+$ ions and $H_2^+$ ions are added. Therefore, by a high proportion of $H_3^+$ included in the ion beam 121, variation in the average penetration depth of the hydrogen ions becomes small; accordingly, a concentration profile of hydrogen in a depth direction in the semiconductor substrate 101 becomes steep, and a peak position of the profile can be made to be shallow. Consequently, it is preferable that $H_3$ is preferably included in the ion beam 121 at greater than or equal to 50%, and further preferably at greater than or equal to 80%, with respect to the total amount of $H^+$, $H_2^+$, and $H_3^+$ included in the ion beam 121.

In the case of performing ion irradiation by an ion-doping method with the use of the hydrogen gas, the acceleration voltage can be set to greater or equal to 10 kV and less than or equal to 200 kV, and the dosage is set to greater than or equal to $1\times10^{16}$ ions/cm$^2$ and less than or equal to $6\times10^{16}$ ions/cm$^2$. By the irradiation with the hydrogen ions under this condition, the embrittlement layer 103 can be formed at a depth of greater than or equal to 50 nm and less than or equal to 500 nm from the surface of the semiconductor substrate 101, though depending on the ion species and its proportion in the ion beam 121.

Helium (He) can also be used as a source gas for the ion beam 121. Most of ion species produced by excitation of helium is $He^+$; therefore, $He^+$ can be mainly added to the semiconductor substrate 101 even by an ion-doping method in which mass separation is not performed. Therefore, microvoids can be formed in the embrittlement layer 103 efficiently by an ion-doping method. When ion irradiation is performed using helium by an ion-doping method, the acceleration voltage can be set to greater than or equal to 10 kV and less than or equal to 200 kV, and the dosage can be set to greater than or equal to $1\times10^{16}$ ions/cm$^2$ and less than or equal to $6\times10^{16}$ ions/cm$^2$.

A halogen gas such as a chlorine gas ($Cl_2$ gas) or a fluorine gas ($F_2$ gas) can be used as the source gas.

Figure 5C:
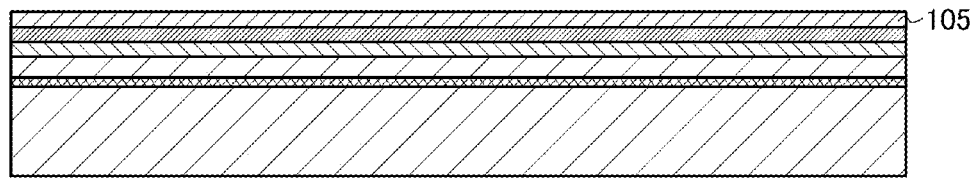

Then, the insulating layer 105 is formed over the surface of the nitrogen-containing layer 104 (see FIG. 5C). As the insulating layer 105, a smooth insulating layer having a hydrophilic surface is preferable and a silicon oxide film is suitable. In particular, a silicon oxide film formed by a chemical vapor deposition method using an organosilane gas is preferable. Examples of an organosilane gas that can be used include silicon-containing compounds such as tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$). Note that a silicon oxynitride film may be used as the insulating layer 105 instead of a silicon oxide film.

The insulating layer 105 is provided so as to have a thickness of greater than or equal to 5 nm and less than or equal to 500 nm. With this thickness, it is possible to smooth surface roughness of a surface of the insulating layer 105 (a surface on which bonding is performed) and also to ensure smoothness of a growing surface of the layer. Further, by provision of the insulating layer 102, thermal distortion of the glass substrate 110 and the semiconductor layer 122 can be relieved. In other words, the semiconductor layer 122 can be bonded to the glass substrate 110 strongly by providing the insulating layer 105 which is formed using a silicon oxide film deposited by using organosilane as a source gas over the surface of the semiconductor layer 122. The surface of the silicon oxide film is preferably set as follows: the average surface roughness (Ra) thereof is less than or equal to 0.5 nm and the root-mean-square roughness (Rms) thereof is less than or equal to 0.6 nm; more preferably, Ra is less than or equal to 0.3 nm and Rms is less than or equal to 0.4 nm.

Figure 5D:
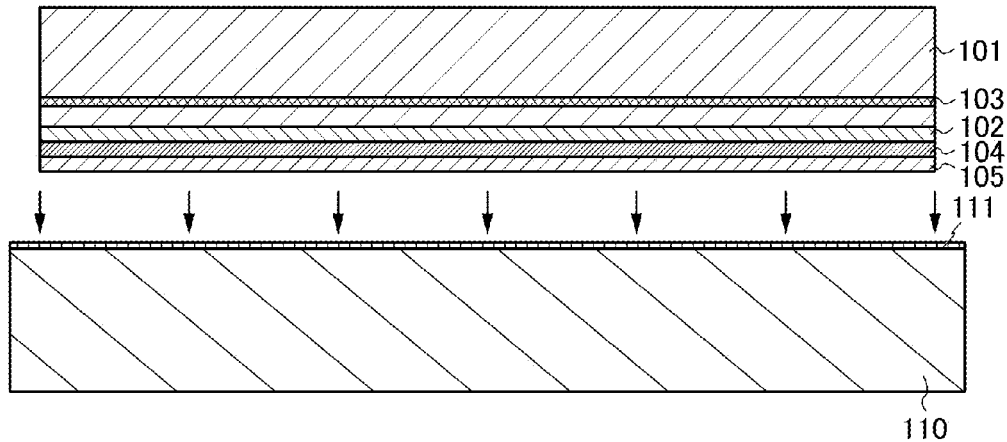

Next, the semiconductor substrate 101 and the glass substrate 110 are bonded to each other with the insulating layer 105 and the altered layer 111 interposed therebetween (see FIG. 5D). Here, the semiconductor substrate 101 and the glass substrate 110 are disposed in close contact with each other and then a pressure of approximately 0.1 N/cm$^2$ to 50 N/cm$^2$, preferably approximately 0.1 N/cm$^2$ to 20 N/cm$^2$ is applied to part of edge of the semiconductor substrate 101. The insulating layer 105 and the altered layer 111 start bonding to each other from the part to which the pressure is applied and the bonded part spontaneously extends throughout the entire surface. This bonding step is performed by the action of van der Waals forces. The bonding resulting from hydrogen bonding of Si—H or Si—OH can be performed by pressing the semiconductor substrate 101 and the glass substrate 110 against each other. This bonding step can be performed at a room temperature without heat treatment; therefore, a substrate whose upper limit temperature is low like the glass substrate 110 can be used.

Further, the altered layer 111 formed on at least the one surface of the glass substrate 110 has a lower density than the glass substrate 110; therefore, the altered layer 111 has small Yung's modulus and thus is easily deformed. Accordingly, in the case where the insulating layer 105 and the altered layer 111 are bonded to each other, even when a foreign material exists on any of the surfaces thereof, the altered layer 111 is deformed, so that unevenness due to the foreign material can be reduced. Therefore, a region in which bond is not formed in a periphery of the foreign material is reduced and the number of the regions is also reduced as compared to the case of bonding with the glass substrate 110 not provided with the altered layer 111. Therefore, as compared to the case where the insulating layer 105 and the glass substrate 110 are bonded to each other, a deficiency region of the semiconductor layer 122 is reduced and thus the number of the deficiency regions is also reduced.

Note that before the bonding of the semiconductor substrate 101 and the glass substrate 110, surface treatment is preferably performed on the insulating layer 105 formed over the semiconductor substrate 101 and the altered layer 111 formed on the glass substrate 110. As the surface treatment, ozone treatment (for example, cleaning with ozone water), megasonic cleaning, two fluid cleaning (a cleaning method of spraying with functional water such as pure water or water to which hydrogen is added together with a carrier gas such as nitrogen), or a combination thereof can be employed. Cleaning with ozone water and cleaning with hydrofluoric acid may be performed on the insulating layer 105 formed over the semiconductor substrate 101 plural times. By performing such surface treatment, dust such as an organic material existing on the surface of the insulating layer 105 and the surface of the altered layer 111 is removed, whereby the surfaces of the insulating layer 105 and the altered layer 111 become hydrophilic.

Here, an example of the ozone treatment different from cleaning with ozone water is described. For example, by irradiation with ultraviolet rays (UV) under an atmosphere including oxygen, ozone treatment can be performed on a surface of a processing object. Ozone treatment in which irradiation with ultraviolet rays is performed under an atmosphere including oxygen is also referred to as UV ozone treatment or ultraviolet ozone treatment. By irradiation with light having a wavelength of less than 200 nm of ultraviolet rays and light having a wavelength of greater than 200 nm of ultraviolet rays under an atmosphere including oxygen, ozone is generated and singlet oxygen can be generated from the ozone. By irradiation with light having a wavelength of less than 180 nm of ultraviolet rays, ozone can be generated and singlet oxygen can also be generated from the ozone.

The followings are examples of reactions resulted from the irradiation with light having a wavelength of less than 200 nm and light having a wavelength of greater than or equal to 200 nm under an atmosphere including oxygen.

$$O_2 + h\nu(\lambda_1\ nm) \rightarrow O(^3P) + O(^3P) \tag{1}$$

$$O(^3P) + O_2 \rightarrow O_3 \tag{2}$$

$$O_3 + h\nu(\lambda_2\ nm) \rightarrow O(^1D) + O_2 \tag{3}$$

In the above reaction formula (1), by irradiation with light (hv) having a wavelength of less than 200 nm ($\lambda_1$ nm) under an atmosphere including oxygen ($O_2$), oxygen atoms in a ground state ($O(^3P)$) is generated. Next, in the above reaction formula (2), when an oxygen atom in a ground state ($O(^3P)$) and oxygen ($O_2$) react to each other, ozone ($O_3$) is generated. Then, in the above reaction formula (3), by irradiation with light having a wavelength of greater than or equal to 200 nm ($\lambda_2$ nm) under an atmosphere including ozone ($O_3$), singlet oxygen in an excited state $O(^1D)$ is generated. Ozone is generated by the irradiation with light having a wavelength of less than 200 nm of ultraviolet rays under the atmosphere including oxygen and then decomposition of ozone is caused by the irradiation with light having a wavelength of greater than or equal to 200 nm, whereby singlet oxygen is generated. The ozone treatment described above can be performed by irradiation with a low-pressure mercury lamp ($\lambda_1$=185 nm and $\lambda_2$=254 nm) under an atmosphere including oxygen, for example.

Further, the following is an example of reactions resulted from the irradiation with light having a wavelength of less than 180 nm under an atmosphere including oxygen.

$$O_2 + h\nu(\lambda_3\ nm) \rightarrow O(^1D) + O(^3P) \tag{4}$$

$$O(^3P) + O_2 \rightarrow O_3 \tag{5}$$

$$O_3 + h\nu(\lambda_3\ nm) \rightarrow O(^1D) + O_2 \tag{6}$$

In the above reaction formula (4), by irradiation with light having a wavelength of less than 180 nm ($\lambda_3$ nm) under an atmosphere including oxygen ($O_2$), singlet oxygen in an excited state ($O(^1D)$) and an oxygen atom in a ground state ($O(^3P)$) are generated. Next, in the above reaction formula (5), when an oxygen atom in a ground state ($O(^3P)$) and oxygen ($O_2$) react to each other, ozone ($O_3$) is generated. In the above reaction formula (6), by irradiation with light having a wavelength of less than 180 nm ($\lambda_3$ nm) under an atmosphere including generated ozone ($O_3$), singlet oxygen in an excited state and oxygen are generated. By performing the irradiation with light having a wavelength of less than 180 nm of ultraviolet rays under the atmosphere including oxygen, ozone is generated and ozone or oxygen are decomposed to generate singlet oxygen. The ozone treatment described above can be performed by irradiation with a Xe excimer UV lamp ($\lambda_3$=172 nm) under an atmosphere including oxygen, for example.

A chemical bond of an organic material or the like attached to a surface of a processing object can be broken by the light having a wavelength of less than 200 nm and the organic material, the organic material whose chemical bond is broken, and the like attached to the surface of the processing object can be decomposed and removed by ozone or singlet oxygen generated from ozone. By performing the ozone treatment described above, hydrophilicity and cleanliness of the surface of the processing object can be increased and favorable bonding can be performed.

By irradiation with ultraviolet rays under an atmosphere including oxygen, ozone is generated. Ozone has an effect of removing an organic material attached to the surface of the processing object. Further, singlet oxygen also has an effect of removing an organic material attached to the surface of the processing object, which is as effective as or more effective than ozone. Ozone and singlet oxygen are examples of oxygen in an activated state and collectively referred to as active oxygen. As described in the above reaction formulae and the like, there is reaction of generation of ozone in generation of singlet oxygen or reaction of generation of singlet oxygen from ozone. Therefore, here, reactions including the reaction to which singlet oxygen contributes are referred to as ozone treatment for convenience.

In addition, in order to perform a favorable bonding of the semiconductor substrate 101 and the glass substrate 110, the surfaces of the altered layer 111 and the insulating layer 105 which are to be bonding surfaces may be activated in advance. For example, the surfaces of the altered layer 111 and the insulating layer 105 on which bonding is performed are irradiated with an atomic beam or an ion beam. When an atomic beam or an ion beam is used, an inert gas neutral atom beam or inert gas ion beam of argon or the like can be used. It is also possible to activate the altered layer 111 and the insulating layer 105 by plasma irradiation or radical treatment. Such a surface treatment makes it possible to easily perform bonding between different kinds of materials even if heat treatment is performed at a temperature of less than 400° C.

Further, after the semiconductor substrate 101 and the glass substrate 110 are bonded to each other with the insulating layer 105 and the altered layer 111 interposed therebetween (see FIG. 6A), one or both of heat treatment and pressure treatment are preferably performed. By performing heat treatment or pressure treatment, bonding strength between the glass substrate 110 and the semiconductor substrate 101 can be increased. The temperature of the heat treatment is lower than or equal to the upper limit temperature of the glass substrate 110. For example, the heat treatment is preferably performed at a temperature of higher than or equal to 200° C. and lower than or equal to 400° C. The pressure treatment is performed so that pressure is applied in a direction perpendicular to the bonding surface, in consideration of the pressure resistance of the glass substrate 110 and the semiconductor substrate 101.

In general, when heat treatment is performed at such a temperature, bonding strength can be increased to some extent; however, it is difficult to obtain enough bonding strength. This is because when heat treatment is performed after bonding of the semiconductor substrate and the glass substrate, a dehydration condensation reaction occurs at the bonding interface and a covalent bond is generated, whereby the bonding strength is increased; however, in order to promote the dehydration condensation reaction, moisture generated at the bonding interface due to the dehydration condensation reaction needs to be removed by heat treatment at a high temperature. In other words, the moisture generated at the bonding interface due to the dehydration condensation reaction can be removed by increasing the heat treatment temperature after the bonding to increase the bonding strength. However, when the heat treatment temperature is low, the moisture generated at the bonding interface due to the dehydration condensation reaction cannot be removed effectively; therefore, the dehydration condensation reaction does not proceed and the bonding strength cannot be increased sufficiently.

However, in this embodiment, impurities, for example, movable ions of alkali metal, alkaline earth metal and the like which contaminate the semiconductor layer are reduced in the altered layer 111, whereby microvoids are formed in the film to increase moisture absorption rate. Accordingly, in the case where moisture exists on the surface of the altered layer 111, the moisture is absorbed quickly and can be scattered into the altered layer 111. Therefore, regardless of the heat treatment temperature, the moisture generated at the bonding interface due to the dehydration condensation reaction is absorbed and scattered into the altered layer 111, so that the dehydration condensation reaction can be promoted efficiently. Thus, even if the heat treatment after the bonding is performed at a low temperature, strong covalent bond is formed between the insulating layer 105 over the semiconductor layer 122 and the altered layer 111 on the glass substrate 110, so that the bonding strength can be increased sufficiently. Accordingly, the deficiency region of the semiconductor layer 122 is reduced and thus the number of the deficiency regions is also reduced.

Figure 6A:
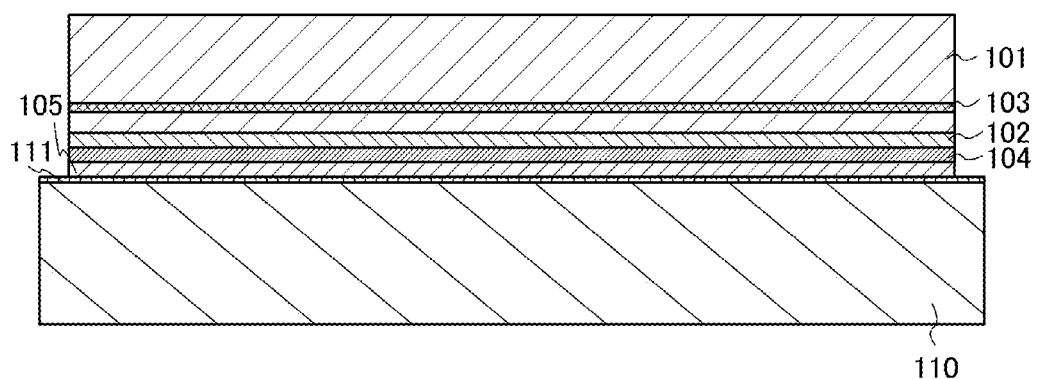
FIGS. 6A and 6B illustrate a method for manufacturing an SOI substrate according to an embodiment of the present invention.
Figure 6B:
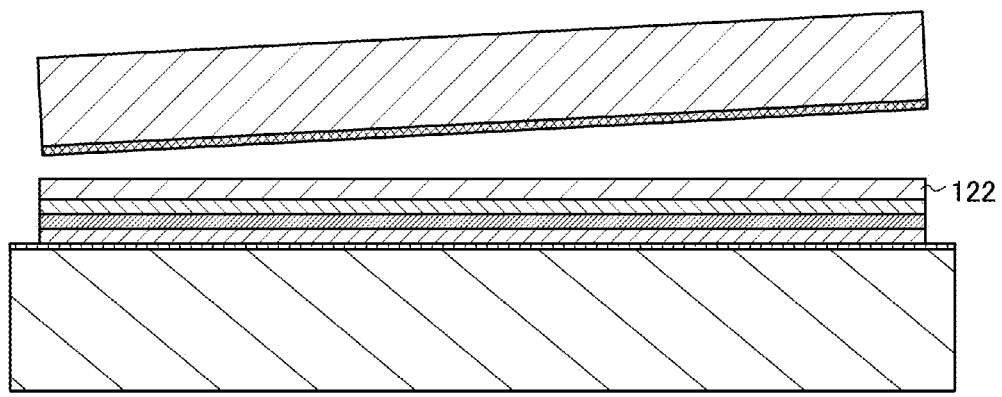

Next, heat treatment is performed, whereby part of the semiconductor substrate 101 is separated from the glass substrate 110, using the embrittlement layer 103 as a separation plane (see FIG. 6B). The heat treatment temperature is preferably higher than or equal to the deposition temperature of the insulating layer 102 and is also preferably lower than or equal to the upper temperature limit of the glass substrate 110. When the heat treatment is performed at, for example, a temperature of higher than or equal to 400° C. and less than or equal to 700° C., microvoids formed in the embrittlement layer 103 change in volume, whereby separation occurs along the embrittlement layer 103. Since the insulating layer 105 is bonded to the altered layer 111, the semiconductor layer 122, which has the same crystallinity as the semiconductor substrate 101, remains over the glass substrate 110. Note that when the heat treatment is performed using an apparatus that is capable of performing rapid heating, such as a rapid thermal annealing (RTA) apparatus, the heat treatment may be performed at a temperature higher than the strain point of the glass substrate 110.

In this manner, the insulating layer 105 over the semiconductor layer 122 and the altered layer 111 on the glass substrate 110 are bonded to each other and then heat treatment is performed plural times, whereby the bonding strength can be increased. Note that heat treatment of FIG. 6B may be performed without the aforementioned heat treatment for increasing the bonding strength between the insulating layer 105 and the altered layer 111, so that the heat treatment step for increasing the bonding strength of the insulating layer 105 and the altered layer 111 and the heat treatment step for separation along the embrittlement layer 103 may be performed at the same time.

Through the above steps, the SOI substrate, as illustrate in FIG. 1C, in which the semiconductor layer 122 is provided over the glass substrate 110 with the insulating layer 102, the nitrogen-containing layer 104, and the insulating layer 105 interposed therebetween can be obtained.

Note that the method for manufacturing an SOI substrate, which is described in this embodiment, is not limited to the above-described method. For example, ions such as hydrogen may be added through the insulating layer 102, the nitrogen-containing layer 104 and the insulating layer 105 not before but after formation of the insulating layer 105, whereby the embrittlement layer 103 may be formed in a region at a predetermined depth from the surface of the semiconductor substrate 101. A surface layer of the insulating layer 105 may be etched after ions are added, whereby a damaged layer formed over the surface of the insulating layer 105 due to the addition of ions may be removed. Further, after silane is adsorbed onto the surface of the insulating layer 105, the insulating layer 105 may exposed to the air to form a thin oxide film (for example, SiOx) over the insulating layer 105, whereby the insulating layer 105 may be flattened. Note that the bonding surface may be activated by performing plasma irradiation or radical treatment on the surface after the oxide film is formed.

Alternatively, ions such as hydrogen may be added not after but before the formation of the insulating layer 102 and the nitrogen-containing layer 104, whereby the embrittlement layer 103 is formed in a region at a predetermined depth from the surface of the semiconductor substrate 101. Note that in this case, it is preferable that a protective layer be formed over the surface of the semiconductor substrate 101 and then ions be added through the protective layer in order to prevent impurities and the like from attaching to the surface of the semiconductor substrate 101 due to addition of ions and to prevent the surface of the semiconductor substrate 101 from being etched due to addition of ions.

As the protective layer, for example, an oxide film which is obtained by performing treatment on the surface of the semiconductor substrate 101 with ozone water, a hydrogen peroxide solution, and a sulfuric acid/hydrogen peroxide mixture in an ozone atmosphere can be used. Alternatively, an oxide film which is obtained by performing oxidation in which halogen is added in an oxidation atmosphere can be used as the protective layer. In the case where a halogen element is included in an oxide film, the oxide film can function as a protective layer which captures impurities such as metals and prevents the semiconductor substrate 101 from being contaminated.

After that, the insulating layer 102, the nitrogen-containing layer 104 and the insulating layer 105 may be formed over the protective layer formed over the semiconductor substrate 101, or the insulating layer 102, the nitrogen-containing layer 104 and the insulating layer 105 may be formed over the semiconductor substrate 101 after the protective layer is removed after ion introduction.

Further, the SOI substrate in which the insulating layer 105 is not formed over the surface of the nitrogen-containing layer 104 may be employed. In this case, the SOI substrate illustrated in FIG. 1B in which the semiconductor layer 122 is provided over the glass substrate 110 with the insulating layer 102 and the nitrogen-containing layer 104 interposed therebetween can be obtained. When the insulating layer 105 is not formed, an insulating layer having a smooth surface is preferably used for the nitrogen-containing layer 104 since the nitrogen-containing layer 104 functions as the bonding layer for bonding with the altered layer 111. It is preferable that the nitrogen-containing layer 104 be formed so that the mean surface roughness (Ra) is less than or equal to 0.5 nm and the root-mean-square roughness (Rms) is less than or equal to 0.6 nm; more preferably, Ra is less than or equal to 0.3 nm and Rms is less than or equal to 0.4 nm. A silicon oxynitride film or a silicon nitride oxide film which is deposited by a plasma CVD method at a low temperature (higher than or equal to 100° C. and lower than or equal to 350° C.; preferably higher than or equal to 150° C. and lower than or equal to 300° C.) is suitable as the nitrogen-containing layer 104. By performing deposition by a plasma CVD method at a low temperature, a silicon oxynitride film or a silicon nitride oxide film which has a smooth surface can be obtained. Further, by performing deposition of the nitrogen-containing layer 104 at a low temperature, the amount of hydrogen (H) included in the film can be increased, which enable strong bonding of the glass substrate 110 and the altered layer 111.

Further, by providing a silicon oxide film having a smooth surface as the insulating layer 102, a surface of the nitrogen-containing layer 104 formed over the insulating layer 102 can be flattened. Note that when the semiconductor substrate 101 has a flat surface, a structure without the insulating layer 102 may be employed. For example, the nitrogen-containing layer 104 can be formed of a single layer selected from a silicon oxynitride film or a silicon nitride oxide film or can be formed of a laminate of layers of a silicon oxynitride film and a silicon nitride oxide film which are stacked on the semiconductor substrate 101 side.

Further, after ion introduction is performed through the nitrogen-containing layer 104 and silane is adsorbed onto the surface of the nitrogen-containing layer 104, the surface of the nitrogen-containing layer 104 is exposed to the air, whereby a thin oxide film (for example, SiOx) may be formed over the nitrogen-containing layer 104. In this case, the surface of the nitrogen-containing layer 104 can be hydrophilic after the ion introduction, and the bonding with the glass substrate 110 can be strengthened. Note that the bonding surface may be activated by performing plasma irradiation or radical treatment on the surface after the oxide film is formed.

Alternatively, the SOI substrate in which the nitrogen-containing layer 104 is not formed over the surface of the insulating layer 102 may be employed. In this case, the SOI substrate illustrated in FIG. 1A in which the semiconductor layer 122 is provided over the glass substrate 110 with the insulating layer 102 interposed therebetween can be obtained. When the nitrogen-containing layer 104 is not formed, an insulating layer having a smooth surface is preferably used for the insulating layer 102 because the surface of the insulating layer 102 is to be the bonding surface for bonding with the altered layer 111; therefore a silicon oxide film is suitable for the insulating layer 102. In particular, a silicon oxide film deposited by a chemical vapor deposition method using an organosilane gas is preferable. This is because the insulating layer 102 can have a flat surface when formed with a silicon oxide film using an organosilane gas. It is preferable that the silicon oxide film be formed so that the mean surface roughness (Ra) thereof is less than or equal to 0.5 nm and the root-mean-square roughness (Rms) thereof is less than or equal to 0.6 nm; more preferably, Ra thereof is less than or equal to 0.3 nm and Rms thereof is less than or equal to 0.4 nm.

Examples of the organosilane gas include silicon-containing compounds such as tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

Note that in the above process, flattening treatment may be performed on a surface of the obtained SOI substrate. By performing the flattening treatment, even when the semiconductor layer 122 provided over the glass substrate 110 has an uneven surface after separation, the surface of the SOI substrate can be flattened.

For the flattening treatment, CMP (chemical mechanical polishing), etching treatment, laser light irradiation, or the like can be performed. Etching treatment (etch-back treatment) which is dry etching, wet etching, or a combination of dry etching and wet etching is performed and then irradiation with a laser beam is performed, whereby the semiconductor layer 122 is recrystallized and the surface thereof is flattened.

By irradiation with the laser beam through the top surface of the semiconductor layer 122, the top surface of the semiconductor layer 122 can be melted. After being melted, the semiconductor layer 122 is cooled and solidified, so that a single crystal semiconductor film having the top surface whose flatness is improved can be obtained. By using a laser beam for irradiation, since the glass substrate 110 is not directly heated, increase in temperature of the glass substrate 110 can be suppressed. Therefore, a low-heat-resistant substrate such as a glass substrate can be used as the glass substrate 110.

Note that it is preferable that the semiconductor layer 122 be partially melted by the laser beam irradiation. This is because, if the semiconductor layer is completely melted, it is microcrystallized due to disordered nucleation after being in a liquid phase, so that crystallinity of the semiconductor layer is highly likely to decrease. On the contrary, by partial melting, crystal growth proceeds from a solid phase part which is not melted. Accordingly, defects in the semiconductor film can be reduced. Here, "complete melting" refers to that the semiconductor layer is melted down to the vicinity of the lower interface thereof to be made in a liquid state. On the other hand, in this case, "partial melting" refers to that the upper part of the semiconductor layer is melted to be made in a liquid phase while the lower part thereof is not melted and is still in a solid phase.

A pulsed laser is preferably used for the laser irradiation. This is because a pulsed laser light with high energy can be emitted instantaneously and a liquid phase can be easily obtained. The repetition rate is preferably approximately 1 Hz to 10 MHz, inclusive.

After the irradiation with the laser beam as described above, a step of thinning the semiconductor layer 122 may be performed. In order to thin the semiconductor layer 122, etching treatment (etch-back treatment) which is dry etching, wet etching or a combination of dry etching and wet etching may be applied. For example, when the semiconductor layer 122 is formed using a silicon material, the semiconductor layer 122 can be thinned by dry etching using $SF_6$ and $O_2$ or only $Cl_2$ as a process gas.

In this manner, even when the glass substrate is used as a base substrate of the SOI substrate, the deficiency region of the semiconductor layer can be reduced; therefore, the SOI substrate provided with the semiconductor layer which can be used practically can be manufactured.

Note that the method for manufacturing an SOI substrate described in this embodiment can be combined with manufacturing methods in other embodiment in this specification, as appropriate.

Embodiment 3

In this embodiment, a method for manufacturing a semiconductor device using the SOI substrate described in Embodiment 1 is described.

First, a method for manufacturing an n-channel thin film transistor and a p-channel thin film transistor is described as a method for manufacturing a semiconductor device with reference to FIGS. 7A to 7D and 8A to 8C. Various kinds of semiconductor devices can be formed by combining a plurality of thin film transistors (TFTs).

Figure 7A:
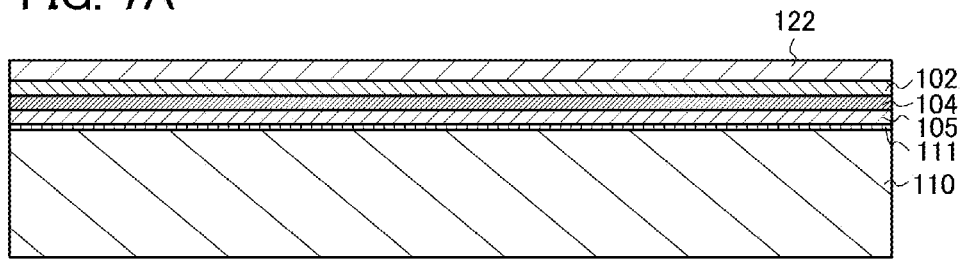
FIGS. 7A to 7D illustrate a method for manufacturing a semiconductor device using an SOI substrate according to an embodiment of the present invention.

The SOI substrate of FIG. 1C which is manufactured according to the method of Embodiment 2 is used as an SOI substrate. FIG. 7A is a cross sectional view illustrating the SOI substrate of FIG. 1C manufactured by a method described with reference to FIGS. 3A and 3B, FIGS. 4A and 4B, FIGS. 5A to 5D and FIGS. 6A and 6B.

Figure 7B:
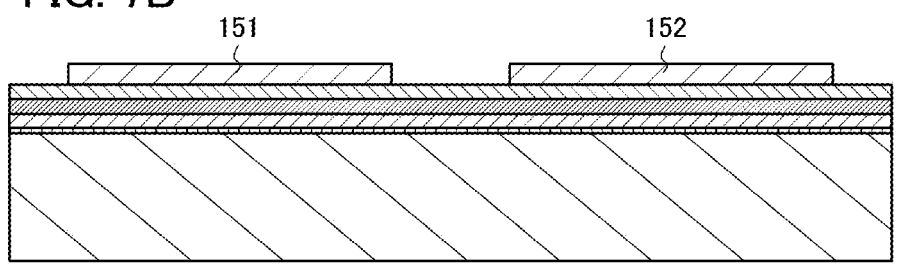

The semiconductor layer 122 of the SOI substrate is isolated into each element by etching, thereby forming semiconductor layers 151 and 152 as illustrated in FIG. 7B. The semiconductor layer 151 constitutes part of an n-channel TFT, and the semiconductor layer 152 constitutes part of a p-channel TFT.

Figure 7C:
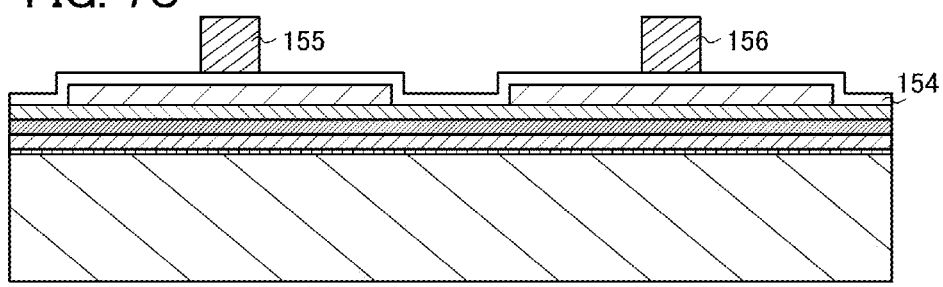

As illustrated in FIG. 7C, an insulating layer 154 is formed over the semiconductor layers 151 and 152. And then, a gate electrode 155 is formed over the semiconductor layer 151 with the insulating layer 154 interposed therebetween, and a gate electrode 156 is formed over the semiconductor layer 152 with the insulating layer 154 interposed therebetween.

Note that before the semiconductor layer 122 is etched, it is preferable to add an impurity element which functions as an acceptor, such as boron, aluminum, or gallium, or an impurity element which functions as a donor, such as phosphorus or arsenic, to the semiconductor layer 122 in order to control the threshold voltage of the TFTs. For example, an acceptor is added to a region where an n-channel TFT is formed and a donor is added to a region where a p-channel TFT is formed.

Figure 7D:
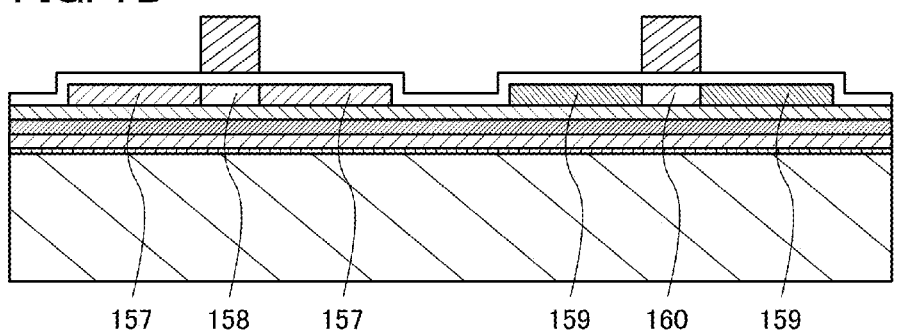

Next, as illustrated in FIG. 7D, n-type low-concentration impurity regions 157 and p-type high-concentration impurity regions 159 are formed in the semiconductor layers 151 and 152 respectively. First, the n-type low-concentration impurity regions 157 are formed in the semiconductor layer 151. In order to form the n-type low-concentration impurity regions 157, the semiconductor layer 152 used for a p-channel TFT is covered with a resist mask, and a donor is added to the semiconductor layer 151. As the donor, arsenic may be added. When the donor is added by an ion-doping method or an ion-implantation method, the gate electrode 155 functions as a mask and thus the n-type low-concentration impurity regions 157 are formed in the semiconductor layer 151 in a self-aligning manner. A region of the semiconductor layer 151 that overlaps with the gate electrode 155 functions as a channel formation region 158.

Next, after removing the mask which covers the semiconductor layer 152, the semiconductor layer 151 used for an n-channel TFT is formed is covered with a resist mask. Next, an acceptor is added to the semiconductor layer 152 by an ion-doping method or an ion-implantation method. Boron can be added as the acceptor. In the step of adding the acceptor, since the gate electrode 156 functions as a mask, the p-type high-concentration impurity regions 159 are formed in the semiconductor layer 152 in a self-aligning manner. The high-concentration impurity regions 159 function as a source region and a drain region. A region of the semiconductor layer 152 which overlaps with the gate electrode 156 functions as a channel formation region 160. Here, explanation has been made on the method in which the p-type high-concentration impurity regions 159 are formed after forming the n-type low-concentration impurity regions 157; however, the p-type high-concentration impurity regions 159 can be formed first.

Figure 8A:
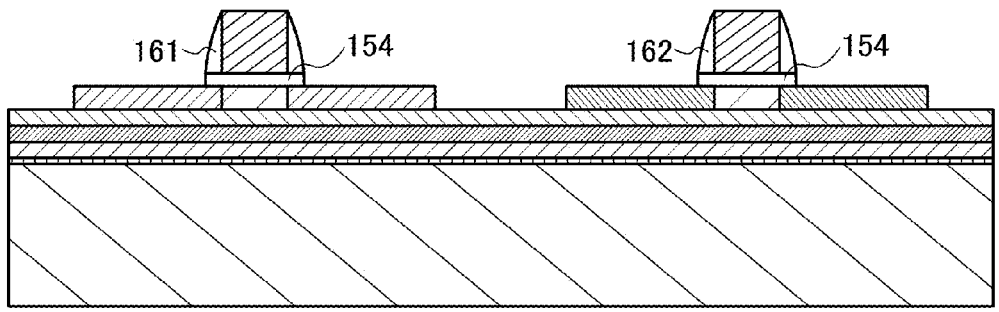
FIGS. 8A to 8C illustrate a method for manufacturing a semiconductor device using an SOI substrate according to an embodiment of the present invention.

Next, after removing the resist that covers the semiconductor layer 151, an insulating film having a single-layer structure or a stacked layer structure which includes a nitrogen compound such as silicon nitride or an oxide such as silicon oxide is formed by a plasma CVD method or the like. This insulating layer is anisotropically-etched in a perpendicular direction, so that side-wall insulating layers 161 and 162 which are in contact with the side surfaces of the gate electrodes 155 and 156 respectively are formed as illustrated in FIG. 8A. By this anisotropic etching, the insulating layer 154 is also etched.

Figure 8B:
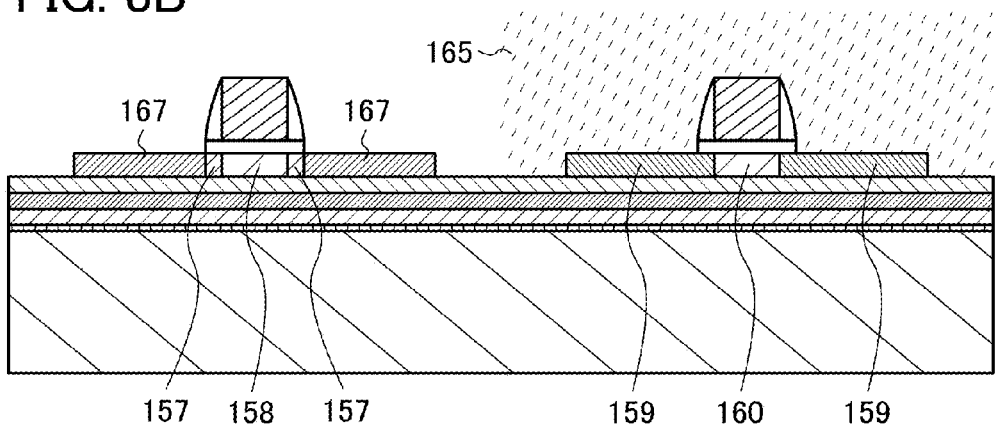

Next, the semiconductor layer 152 is covered with a resist 165, as illustrated in FIG. 8B. In order to form the high-concentration impurity regions functioning as a source region and a drain region in the semiconductor layer 151, a large dosage of donors are added to the semiconductor layer 151 by an ion-doping method or an ion-implantation method. The gate electrode 155 and the side-wall insulating layer 161 function as a mask, and n-type high-concentration impurity regions 167 are formed. Next, heat treatment for activating the donors and the acceptors is performed.

Figure 8C:
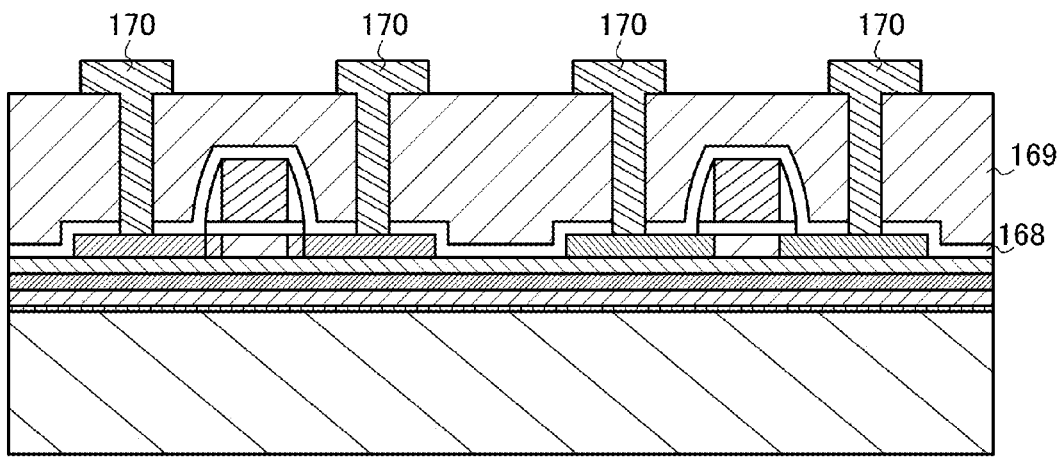

After the heat treatment for activation, as illustrated in FIG. 8C, an insulating layer 168 including hydrogen is formed. After forming the insulating layer 168, heat treatment is performed at temperatures of higher than or equal to 350° C. and lower than or equal to 450° C., so that hydrogen in the insulating layer 168 is diffused into the semiconductor layers 151 and 152. The insulating layer 168 can be formed by depositing silicon nitride or silicon nitride oxide by a plasma CVD method at less than or equal to 350° C. By supplying hydrogen into the semiconductor layers 151 and 152, defects which turn into trapping centers in the semiconductor layers 151 and 152 or at an interface between the semiconductor layers 151 and 152 and the insulating layer 154 can be effectively compensated.

After that, an interlayer insulating layer 169 is formed. The interlayer insulating layer 169 can be formed using a film with a single layer structure or a stacked layer structure which is formed of any one or more of films selected from an insulating film containing an inorganic material such as a silicon oxide film or a BPSG (boron phosphorus silicon glass) film, or an organic resin film containing polyimide, acrylic, or the like. Contact holes are formed in the interlayer insulating layer 169, wirings 170 are formed as illustrated in FIG. 8C. The wirings 170 can be formed using a conductive film with a three-layer structure in which a low-resistance metal film such as an aluminum film or an aluminum-alloy film is sandwiched between barrier metal films. The barrier metal films can be formed using metal films which include molybdenum, chromium, titanium, and/or the like.

Through the above steps, a semiconductor device having the n-channel TFT and the p-channel TFT can be manufactured. Since the deficiency region of the semiconductor layer is reduced in a process for manufacturing the SOI substrate as described in Embodiment 1 and Embodiment 2, TFTs having high reliability can be manufactured.

Although the method for manufacturing TFTs is described with reference to FIGS. 7A to 7D and 8A to 8C, a semiconductor device with high added value can be manufactured by forming a variety of semiconductor elements such as a capacitor and a resistor together with the TFTs. Hereinafter, specific embodiments of the semiconductor device will be described with reference with drawings.

Figure 9:
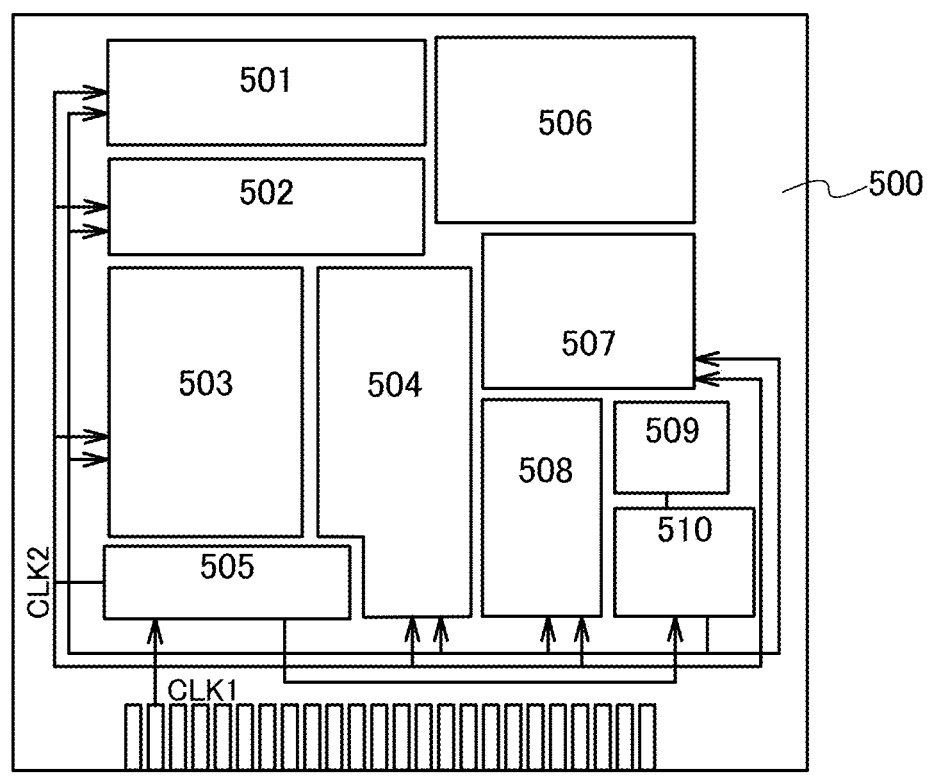
FIG. 9 is a diagram showing a semiconductor device using an SOI substrate according to an embodiment of the present invention.

First, a microprocessor is described as an example of a semiconductor device. FIG. 9 is a block diagram illustrating a structural example of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory (ROM) 509, and a ROM interface 510.

An instruction input to the microprocessor 500 via the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction.

The ALU controller 502 generates signals for controlling the operation of the ALU 501. While the microprocessor 500 is executing a program, the interrupt controller 504 judges an interrupt request from an external input and output device or a peripheral circuit based on its priority or a mask state, and processes the interrupt request. The register controller 507 generates an address of the register 506, and reads/writes data from/to the register 506 in accordance with the state of the microprocessor 500. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As shown in FIG. 9, the internal clock signal CLK2 is input to another circuit.

Figure 10:
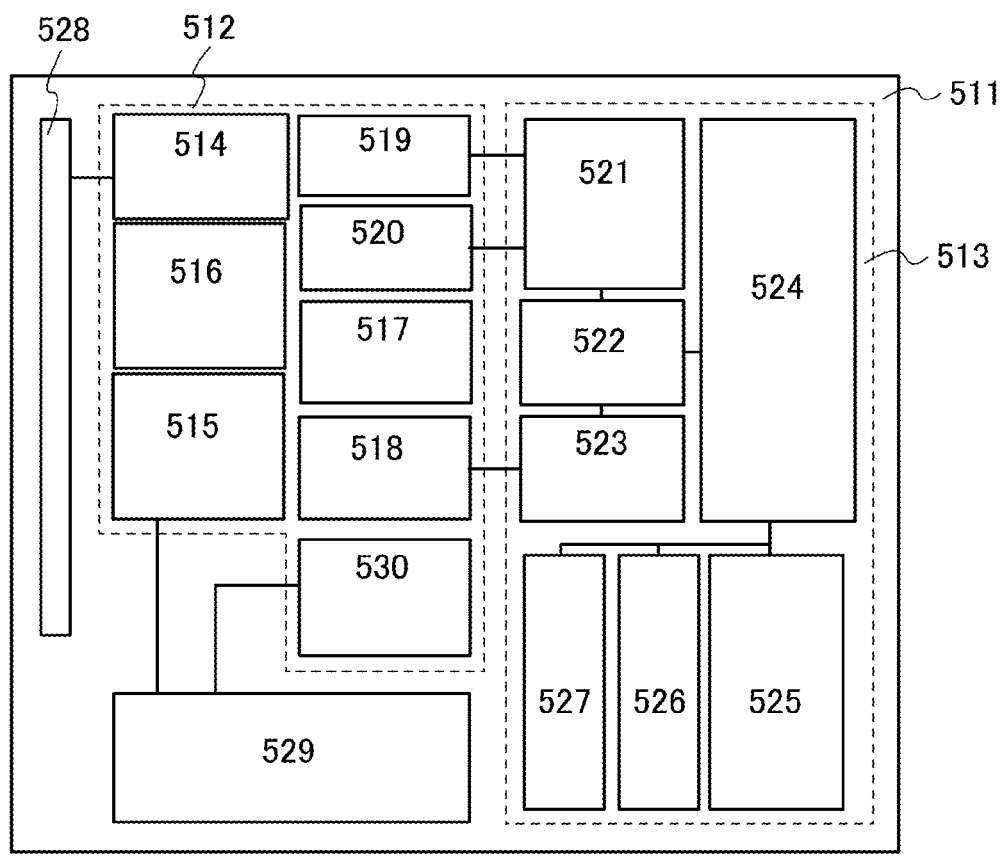
FIG. 10 is a diagram showing a semiconductor device using an SOI substrate according to an embodiment of the present invention.

Next, an example of a semiconductor device having a function of communicating data wirelessly and also having an arithmetic function is described. FIG. 10 is a block diagram showing a structural example of such a semiconductor device. The semiconductor device shown in FIG. 10 can be regarded as a computer (hereinafter also referred to as an "RFCPU") which operates to transmit/receive signals to/from an external device by radio communication.

As shown in FIG. 10, an RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, a CPU interface 524, a central processing unit (CPU) 525, a random access memory (RAM) 526, and a read only memory (ROM) 527.

The operation of the RFCPU 511 is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated over the same substrate as the RFCPU 511 and may be incorporated into the RFCPU 511 as a component.

The reset circuit 517 generates signals for resetting the digital circuit portion 513 and initializing the digital circuit portion 513. For example, the reset circuit generates a signal which rises after rise in the supply voltage with delay as a reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the CPU interface 524. The CPU interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method in which a circuit dedicated to arithmetic is formed and an arithmetic process is conducted using hardware may be employed. In a method in which both hardware and software are used, part of arithmetic processing can be conducted by a circuit dedicated to arithmetic, and the other part of the arithmetic processing can be conducted by the central processing unit 525 using a program.

Next, a display device as a semiconductor device is described with reference to FIG. 11, FIGS. 12A and 12B, and FIGS. 13A and 13B.

In the SOI substrate described in Embodiment 1, the glass substrate 110 can be applied for the base substrate. Therefore, by using the glass substrate 110 as the base substrate and bonding a plurality of semiconductor layers thereto, a large-sized SOI substrate with each side over one meter in length can be manufactured.

Figure 11:
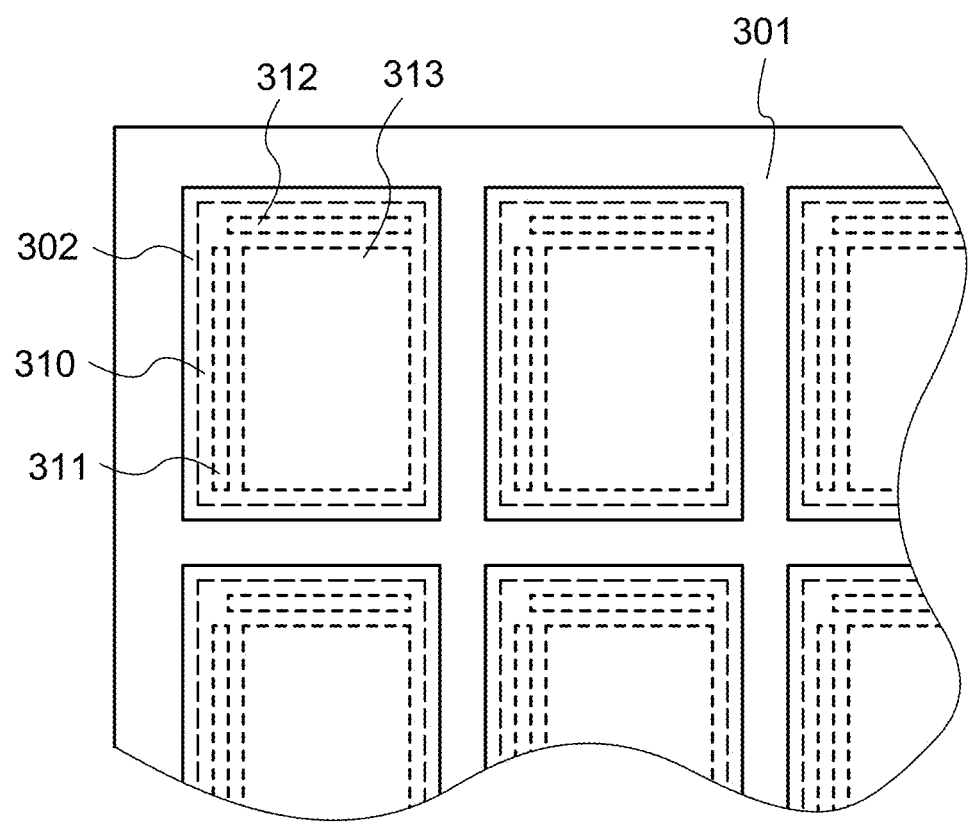
FIG. 11 illustrates a display device using an SOI substrate according to an embodiment of the present invention.

A large-area glass substrate called mother glass for manufacturing a display panel can be used as a glass substrate of an SOI substrate. FIG. 11 is a front view of an SOI substrate in which mother glass is used as the glass substrate. With a plurality of semiconductor elements formed using such a large-area SOI substrate, a liquid crystal display device or an electroluminescent display device can be manufactured. In addition to such display devices, various kinds of semiconductor devices such as a solar cell, a photo IC, and a semiconductor memory device can be manufactured using the SOI substrate.

As illustrated in FIG. 11, single crystal semiconductor layers 302 which are separated from a plurality of semiconductor substrates are bonded to one mother glass 301. In order to cut out a plurality of display panels from the mother glass 301, formation regions 310 of the display panels are preferably included in the single crystal semiconductor layers 302. Each of the display panels includes a scanning line driver circuit, a signal line driver circuit, and a pixel portion. Therefore, the formation regions 310 of the display panels include a region where a scanning line driver circuit formation region 311, a signal line driver circuit formation region 312, and a pixel formation region 313 are formed.

Figure 12A:
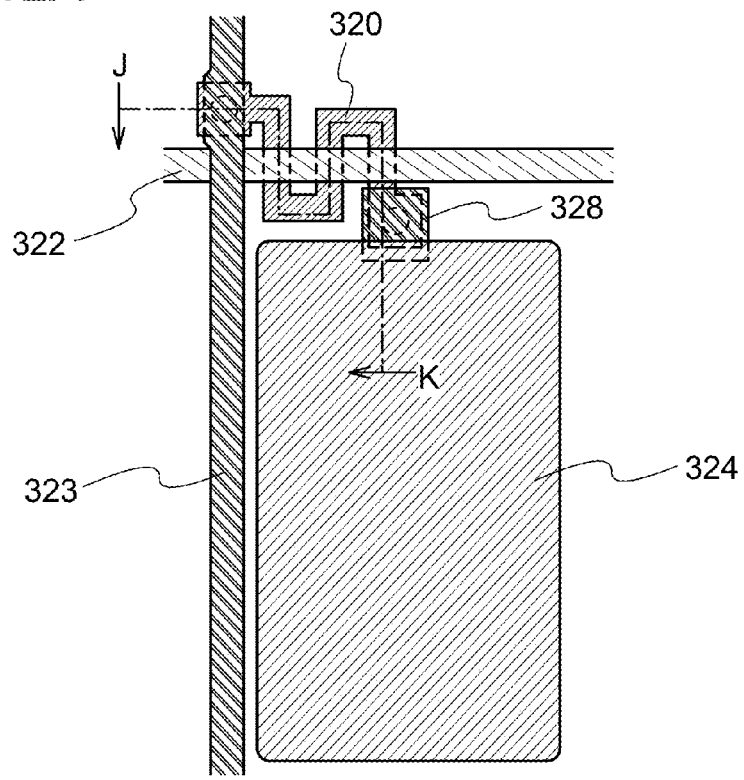
FIGS. 12A and 12B illustrate a display device using an SOI substrate according to an embodiment of the present invention.
Figure 12B:
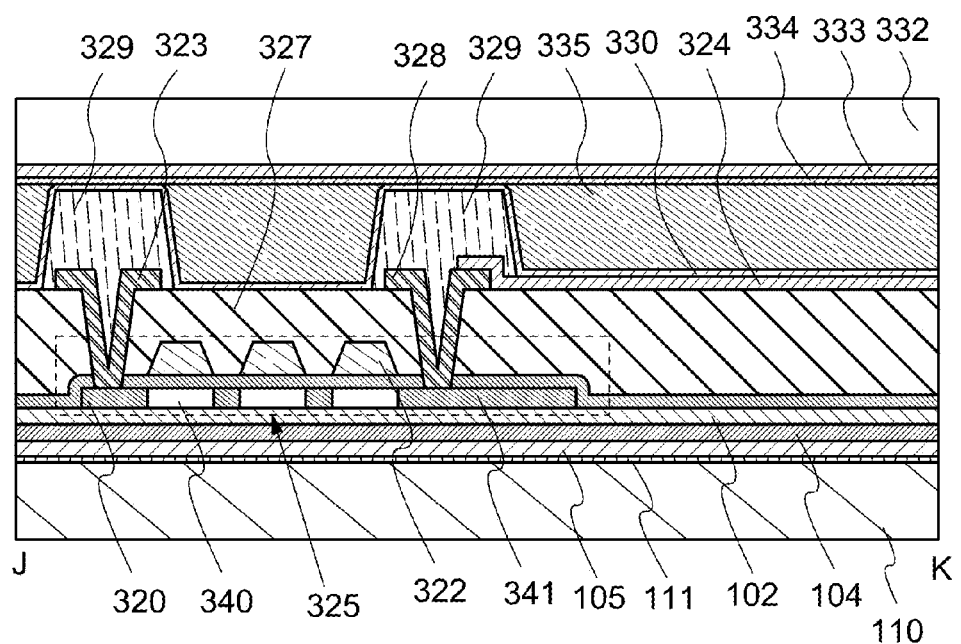

FIGS. 12A and 12B are drawings for describing a liquid crystal display device. FIG. 12A is a plane view of a pixel of the liquid crystal display device, and FIG. 12B is a cross-sectional view taken along a line J-K in FIG. 12A.

As illustrated in FIG. 12A, the pixel includes a single crystal semiconductor layer 320, a scanning line 322 intersecting with the single crystal semiconductor layer 320, a signal line 323 intersecting with the scanning line 322, a pixel electrode 324, and an electrode 328 which electrically connects the pixel electrode 324 with the single crystal semiconductor layer 320. The single crystal semiconductor layer 320 is a layer illustrated in FIG. 11 formed using the single crystal semiconductor layer 302 bonded to the SOI substrate and is included in a TFT 325 of the pixel.

As the SOI substrate, the SOI substrate described in Embodiment 1 is used. As illustrated in FIG. 12B, the insulating layer 105, the nitrogen-containing layer 104, the insulating layer 102, and the single crystal semiconductor layer 320 are stacked over the glass substrate 110 having one surface on which the altered layer 111 is formed. The glass substrate 110 is the mother glass 301 which has been divided. The single crystal semiconductor layer 320 of the TFT 325 is formed by element isolation of the semiconductor layer of the SOI substrate by etching. A channel formation region 340 and n-type high-concentration impurity regions 341 to which donors are added are formed in the single crystal semiconductor layer 320. A gate electrode of the TFT 325 is included in the scanning line 322 and one of a source electrode and a drain electrode of the TFT 325 is included in the signal line 323.

The signal line 323, the pixel electrode 324, and the electrode 328 are provided over the interlayer insulating film 327. Columnar spacers 329 are formed over the interlayer insulating film 327. An orientation film 330 is formed so as to cover the signal line 323, the pixel electrode 324, the electrode 328, and the columnar spacers 329. A counter substrate 332 is provided with a counter electrode 333 and an orientation film 334 which covers the counter electrode 333. The columnar spacers 329 are formed in order to maintain a space between the glass substrate 110 and the counter substrate 332. A liquid crystal layer 335 is formed in the space formed by the column spacers 329. The interlayer insulating film 327 has a step at the connection portion between the high-concentration impurity regions 341, and the signal line 323 and the electrode 328 due to formation of contact holes; therefore, orientation of liquid crystals in the liquid crystal layer 335 is likely to be disordered at this connection portion. Therefore, the columnar spacers 329 are formed at these step portions to prevent disorder of liquid crystal orientation.

Figure 13A:
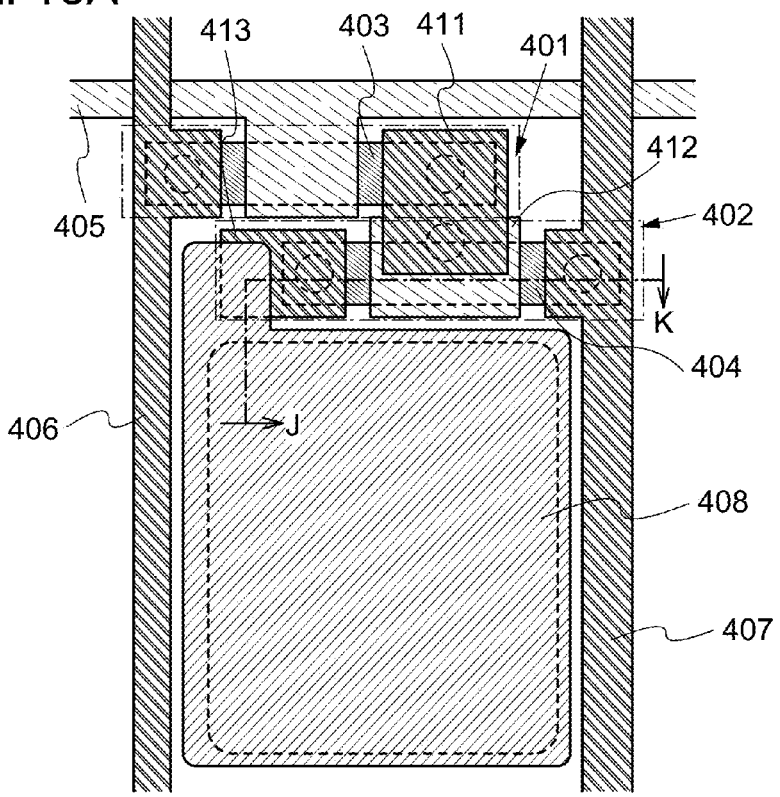
FIGS. 13A and 13B illustrate a display device using an SOI substrate according to an embodiment of the present invention.
Figure 13B:
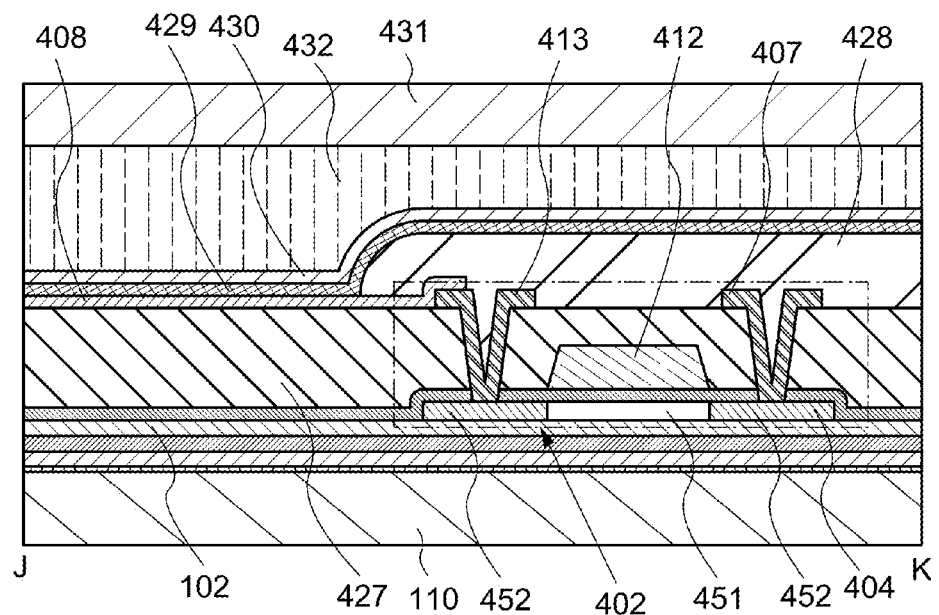

Next, an electroluminescent display device (hereinafter referred to as an EL display device) is described with reference to FIGS. 13A and 13B. FIG. 13A is a plan view of a pixel of an EL display device and FIG. 13B is a cross-sectional view taken along a line J-K of FIG. 13A.

As illustrated in FIG. 13A, the pixel includes a selection transistor 401 and a display control transistor 402 each including a TFT, a scanning line 405, a signal line 406, a current supply line 407, and a pixel electrode 408. In the EL display device, each pixel is provided with a light-emitting element having a structure in which a layer including an electroluminescent material (this layer is also referred to as an EL layer) is sandwiched between a pair of electrodes. One electrode of the light emitting element is the pixel electrode 408. Further, in a semiconductor layer 403, a channel formation region, a source region, and a drain region of the selection transistor 401 are formed. Further, in a semiconductor layer 404, a channel formation region, a source region, and a drain region of the display control transistor 402 are formed. The semiconductor layers 403 and 404 are layers illustrated in FIG. 11 formed using the single crystal semiconductor layer 302 bonded to the SOI substrate.

In the selection transistor 401, a gate electrode is included in the scanning line 405, one of a source electrode and a drain electrode is included in the signal line 406 and the other thereof is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

The display control transistor 402 is a p-channel TFT. As illustrated in FIG. 13B, a channel formation region 451 and p-type high-concentration impurity regions 452 are formed in the semiconductor layer 404. As an SOI substrate, the SOI substrate manufactured according to the method of Embodiment 2 is used.

An interlayer insulating film 427 is formed so as to cover the gate electrode 412 of the display control transistor 402. The signal line 406, the current supply line 407, the electrode 411, the electrode 413, and the like are formed over the interlayer insulating film 427. Further, the pixel electrode 408 which is electrically connected to the electrode 413 is formed over the interlayer insulating film 427. A peripheral portion of the pixel electrode 408 is surrounded by a partition wall layer 428 having an insulating property. The EL layer 429 is formed over the pixel electrode 408, and a counter electrode 430 is formed over the EL layer 429. A counter substrate 431 is provided as a reinforcing plate and is fixed to the glass substrate 110 by a resin layer 432.

The grayscale of the EL display device is controlled by either a current drive method by which the luminance of the light-emitting element is controlled by the amount of current or a voltage drive method by which control is performed basically by the amount of voltage. The current drive method is difficult to adapt when transistors have characteristics which are largely different for each pixel, and therefore a compensation circuit for compensating variation in characteristics is necessary. The EL display device is manufactured by a manufacturing process of an SOI substrate and a manufacturing method including a gettering step so that the selection transistor 401 and the display control transistor 402 do not have variation in characteristics in each pixel. Accordingly, the current driving method can be employed.

Namely, various electronic appliances can be manufactured by using SOI substrates. The electronic appliances include, in its category, cameras such as video cameras, digital cameras, navigation systems, audio reproducing devices (such as car audios or audio components), computers, game machines, portable information terminals (such as mobile computers, mobile phones, portable game machines, or e-book readers), and image reproducing devices having storage media (specifically, devices provided with display devices capable of playing audio data stored in recording media such as digital versatile disk (DVD) and displaying stored image data).

Figure 14A:
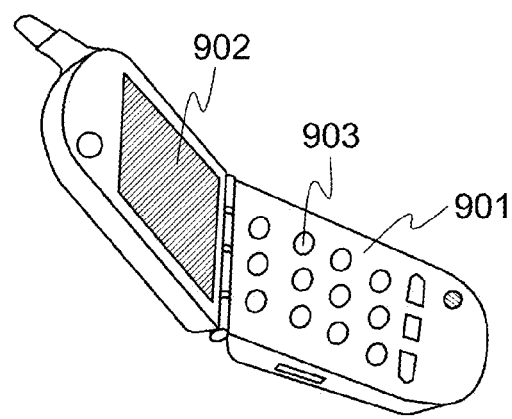
FIGS. 14A to 14C each illustrate an electronic appliance in which an SOI substrate according to an embodiment of the present invention is used.
Figure 14B:
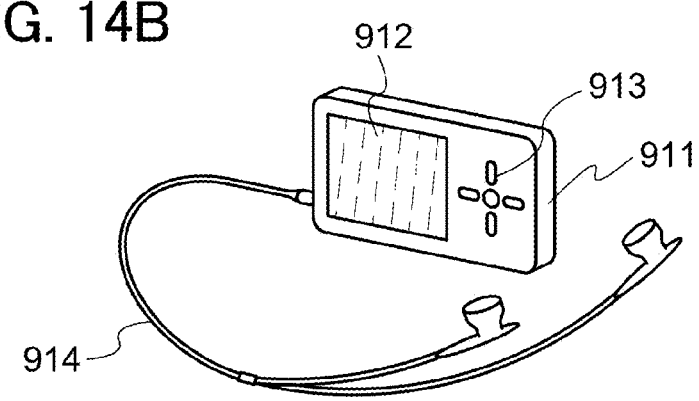
Figure 14C:
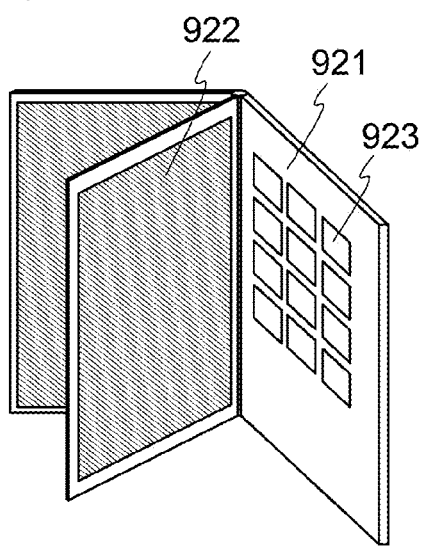

Specific modes of the electronic appliances is described using FIGS. 14A to 14C. FIG. 14A is an external view illustrating an example of a cellular phone 901. This cellular phone 901 includes a display portion 902, operation switches 903 and the like. The liquid crystal display device illustrated in FIGS. 12A and 12B or the EL display device illustrated in FIGS. 13A and 13B is applied to the display portion 902, whereby the display portion 902 can have little display unevenness and excellent image quality.

FIG. 14B is an external view illustrating a structural example of a digital player 911. The digital player 911 includes a display portion 912, an operation portion 913, an earphone 914, and the like. Instead of the earphone 914, a headphone or a wireless earphone can be used. By applying the liquid crystal display device described illustrated in FIGS. 12A and 12B or the EL display device illustrated in FIGS. 13A and 13B to the display portion 912, even in the case where the screen size is about 0.3 inches to 2 inches, an image with high precision and a large amount of text information can be displayed.

Further, FIG. 14C is an external view of an electronic book 921. This electronic book 921 includes a display portion 922 and operation switches 923. A modem may be incorporated in the electronic book reader 921, or the RFCPU in FIG. 10 may be incorporated therein so that the electronic book reader 921 has a structure with which information can be transmitted and received wirelessly. By applying the liquid crystal display device illustrated in FIGS. 12A and 12B or the EL display device illustrated in FIGS. 13A and 13B to the display portion 922, an image with high image quality can be displayed.

Example 1

This example describes evaluation results of an altered layer which is formed on at least one surface of a glass substrate according to the present invention.

In this example, a glass substrate A in which an altered layer is formed on its surface layer by HPM treatment and an untreated glass substrate B are prepared. Each surface thereof is measured by X-ray reflectivity (XRR) measurement and X-ray photoelectron spectroscopy (XPS).

Here, the XRR measurement refers to a measurement method in which: X-rays enter a flat thin film at a very shallow incident angle; and the thickness, density and flatness of the thin film are measured by utilizing a phenomenon in which X-rays reflected at an surface of the thin film and an interface between the thin film and the substrate interfere with each other. Note that a measurement region of the XRR measurement is a quadrangle region having a size of 8 nm to 15 nm square. Since measurement is performed changing the incident angle of X-rays, the measurement region is changed in accordance with the incident angle of the X-rays. Further, the thickness, density and flatness are calculated from the average value of the intensity of X-rays which are reflected at respective parts of the measurement region.

In addition, the XPS refers to a method in which the energy distribution of photoelectron emitted by irradiating a sample with X-rays is detected and findings about the kind, the number and chemical condition of elements on a surface of the sample are obtained.

The samples used in this example are described. As the glass substrates A and B, non-alkali glass substrates (the trade name is AN 100) manufactured by ASAHI GLASS CO., LTD. were used. Note that the non-alkali glass includes an extremely small number of alkali metal and alkaline earth metal although called "a non-alkali glass". Each thickness of the glass substrates A and B was 0.7 mm. Of them, the glass substrate A was provided with an altered layer on its surface layer by HPM treatment.

The samples were manufactured as follows. First, hydrochloric acid, a hydrogen peroxide solution and pure water were mixed with a ratio of 1:1:5 to generate a hydrochloric acid/hydrogen peroxide solution mixture (HPM). Next, the glass substrate A was soaked in a cleaning bath filled with HPM solution having a temperature of 70° C., for 10 minutes. After that, the glass substrate A was soaked in a cleaning bath filled with pure water for 10 minutes and then dried with a rinser dryer to remove water droplets on the glass substrate. In this manner, the altered layer was formed on the surface of the glass substrate A. The glass substrate B was left untreated.

TABLE 1

| sample | layer | density (g/cm3) | thickness (nm) | roughness (nm) |
|---|---|---|---|---|
| glass substrate A | altered layer | 2.06 | 9.22 | 0.8 |
|  | intermediate layer | 2.23 | 2.4 | 0.83 |
|  | glass layer | 2.5 |  | 0.92 |
| glass substrate B | glass layer | 2.5 |  | 0.92 |

Data shown in Table 1 is obtained in such a manner that fitting is performed on the measurement results of the X-ray reflection intensity of the glass substrate A and the glass substrate B by the XRR measurement, by performing simulation employing a model in which the altered layer has two layers which differ in density. Note that in the XRR measurement of this example, the measurement region at the start of the measurement is a quadrangle region having a size of 10 mm in a direction of travel of X-rays and 8 mm in a direction perpendicular thereto at the center of the glass substrate; the measurement region at the termination of the measurement is a quadrangle region having a size of 8 mm in the direction of travel of X-rays and 8 mm in the direction perpendicular thereto. According to Table 1, it is shown that the density of a glass layer of the glass substrate A is the same as that of the untreated glass substrate B and the density of the altered layer (its thickness is 9.22 nm) of the glass substrate A subjected to HPM treatment is lower than that of the glass layer thereof. In addition, the roughness of the altered layer of the glass substrate A is smaller than that of each glass layer of the glass substrate A and the glass substrate B. Further, it can be found that an intermediate layer (its thickness is 2.4 nm) having density and roughness which are between those of the glass layer and those of the altered layer is formed between the glass layer and the altered layer of the glass substrate A.

Figure 15B:
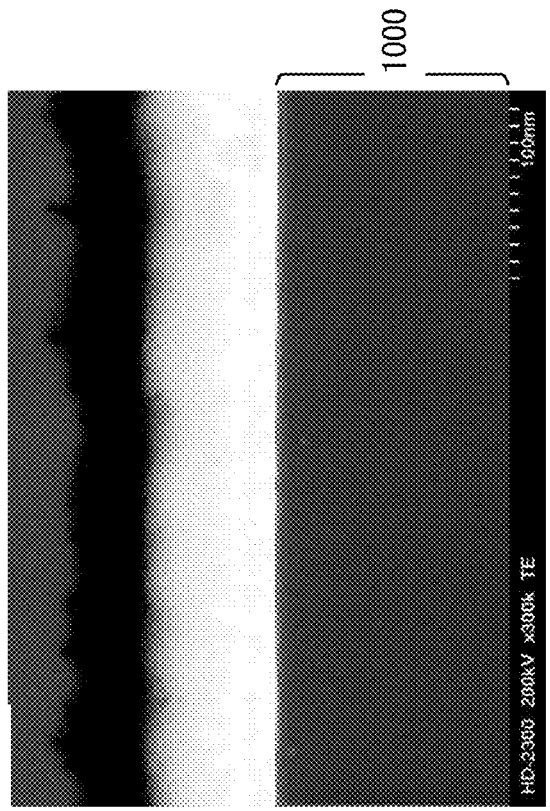
FIGS. 15A and 15B are STEM images of a glass substrate according to an example of the present invention.
Figure 15A:
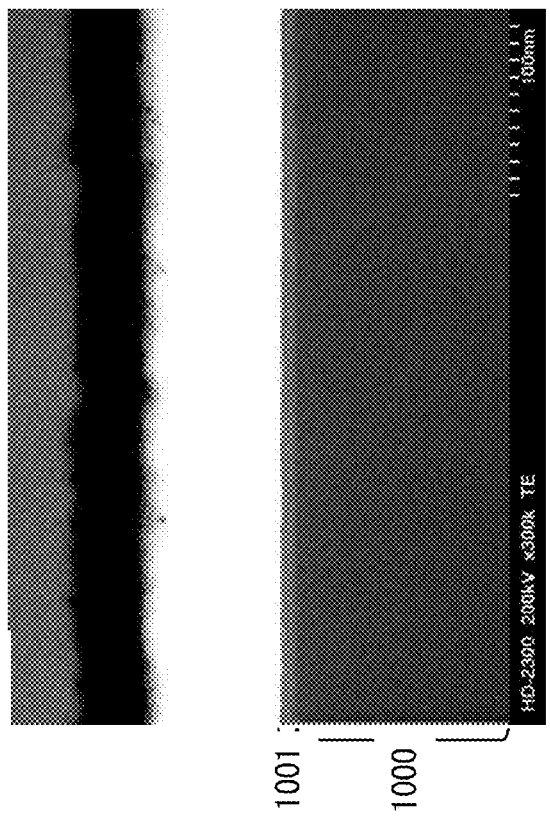

In addition, STEM (scanning transmission electron microscope) images of the surface portions of the glass substrate A and the glass substrate B are shown in FIGS. 15A and 15B, respectively. By comparison between FIGS. 15A and 15B, an altered layer 1001 with a thickness of approximately 9.3 nm certainly exists on a glass layer 1000 in FIG. 15A, which attests the results of XRR measurement. Note that films over the glass substrates in FIGS. 15A and 15B are films of carbon and metal for taking STEM images.

TABLE 2

| | sample | | | | | | |
|---|---|---|---|---|---|---|---|
| | Si (atomic %) | O (atomic %) | Al (atomic %) | Sr (atomic %) | B (atomic %) | Ca (atomic %) | Mg (atomic %) |
| glass substrate A | 28.4 | 70.7 | 0.8 | 0.1 | — | — | — |
| glass substrate B | 21.5 | 66.8 | 5.9 | 1.2 | 3 | 1.1 | 0.4 |

Measurement results of the glass substrate A and the glass substrate B by the XPS are shown in Table 2. In the XPS of this example, Quantera SXM manufactured by PHI incorporated was used as a measurement apparatus and monochromatic AlKα ray (1.486 keV) was used for an X-ray source. The diameter of a detection region was set to 100 µm and the depth thereof was set to greater than or equal to 4 nm and less than or equal to 5 nm. According to Table 2, it is shown that alkaline earth metal atoms of Sr, Ca and Mg, metal atoms of Al and B, and the like, which exist over the surface of the untreated glass substrate B at a concentration of several at. %, exist over the glass substrate A after the HPM treatment at a concentration of less than 1 at. % or less than the lower limit of the detection. In a similar manner, it is presumed that impurities such as alkali metal atoms which exist at a concentration less than the lower limit of the detection are reduced. Further, existence ratio of Si and that of O at the surface of the glass substrate A are relatively increased as compared with those at the surface of the glass substrate B.

Figure 16:
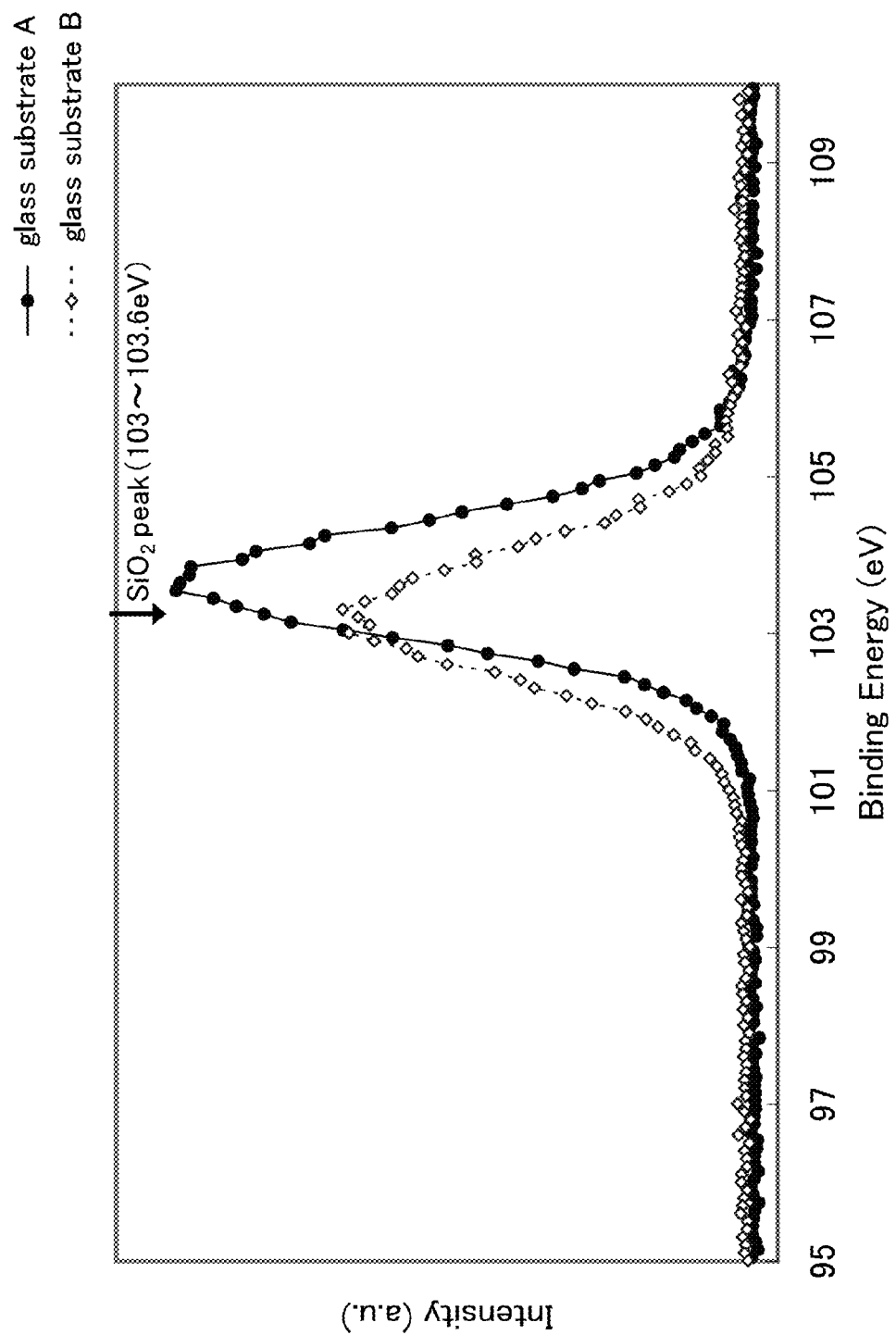
FIG. 16 is a graph of photoelectron spectroscopy spectrum by XPS of a glass substrate according to an example of the present invention.
Figure 17:
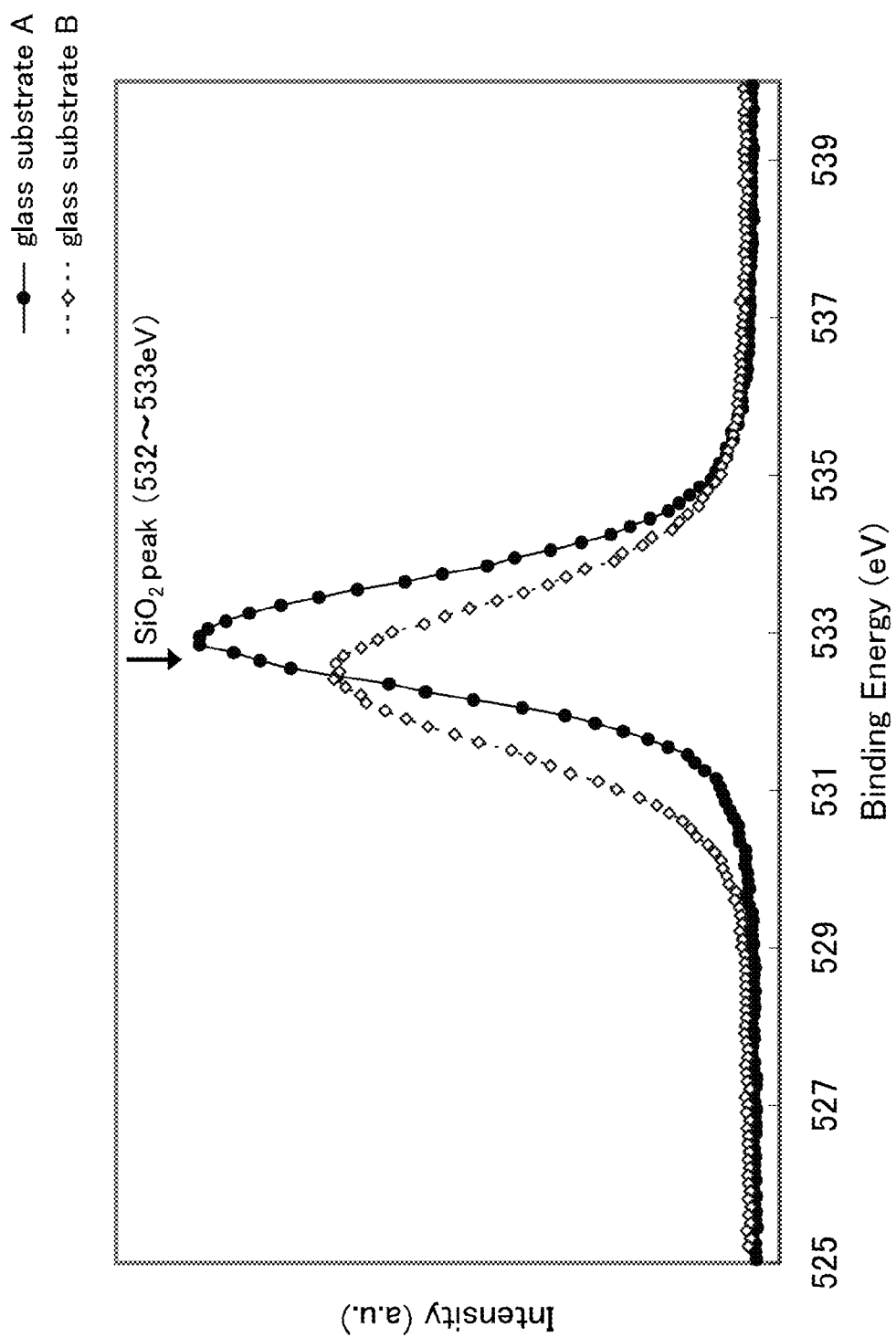
FIG. 17 is a graph of photoelectron spectroscopy spectrum by XPS of a glass substrate according to an example of the present invention.

Next, the photoelectron spectroscopy spectra of Si-2p orbitals of the glass substrate A and the glass substrate B, and the photoelectron spectroscopy spectra of O-1s orbitals of the glass substrate A and the glass substrate B are shown in FIG. 16 and FIG. 17, respectively. According to FIG. 16 and FIG. 17, in each of the photoelectron spectroscopy spectra of the Si-2p orbitals of the glass substrate A and the glass substrate B and the O-1s orbitals thereof, a peak corresponding to chemical shift of $SiO_2$ appears. In each of photoelectron spectroscopy spectra of the Si-2p orbitals and the O-1s orbitals, a peak corresponding to the chemical shift of $SiO_2$ of the glass substrate A is sharper than that of the glass substrate B. Accordingly, it is understood that Si and O which are relatively increased in existence ratio at the surface layer of the glass substrate A mainly form silicon oxide ($SiO_2$).

Accordingly, it was found that when the HPM treatment was performed on the glass substrate, the altered layer having a higher proposition of silicon oxide in its composition and a lower density than the glass layer was formed on the surface layer of the glass substrate.

Example 2

In this example, evaluation results of a deficiency region of a single crystal silicon film of an SOI substrate manufactured according to the present invention are described.

In this example, three kinds of substrates, that is, an SOI substrate C manufactured with the use of a glass substrate C subjected to HPM treatment, an SOI substrate D manufactured with the use of a glass substrate D subjected to HPM treatment and ultrasonic cleaning and an SOI substrate E manufactured with the use of a glass substrate E which is untreated were manufactured, and detection of the deficiency region of a single crystal silicon film was performed with the use of a deficiency region detecting apparatus (a glass substrate surface detecting apparatus GI-4600 manufactured by Hitachi electronic engineering corporation). In the deficiency region detecting apparatus, a sample substrate is irradiated with a laser beam having a wavelength of 780 nm and an output of 30 mW and then scattered light reflected at unevenness and light passing through the deficiency region are detected by an optical receiver, whereby the number of the deficiency regions can be counted. Scanning with a laser beam is performed in an X axis direction and the sample substrate is moved together with a table in a Y direction to scan a region of a single crystal silicon film having a size of 107 mm square, so that the deficiency regions of the single crystal silicon film are detected. Note that the deficiency region detecting apparatus used in this example recognizes the deficiency regions of the single crystal silicon as severe recessed portions and detects them. Therefore, since unevenness of a surface, dust and a blemish are also detected, evaluation and comparison need to be performed with the results regarded as qualitative numerical values.

The samples used in this example are described. First, respective glass substrates used for the SOI substrates are described. The glass substrate C used for the SOI substrate C was subjected to the same treatment as that of the glass substrate A in Example 1. In a process of the same treatment as the glass substrate A of Example 1, an ultrasonic oscillation bath in which a solution could be subjected to ultrasonic oscillation was filled with an HPM solution and the glass substrate D used for the SOI substrate D was soaked in the cleaning bath filled with an HPM solution for 10 minutes while ultrasonic oscillation having a frequency of 37 kHz is applied thereto. Then, in a similar manner to the glass substrate A in Embodiment 1, the glass substrate was soaked in a cleaning bath filled with pure water for 10 minutes and then dried with a rinser dryer, so that water droplets on the glass substrate were removed. In this manner, an altered layer was formed on each of surface layers of the glass substrate C and the glass substrate D. Further, the glass substrate E was left untreated. Note that each thickness of the glass substrate C, the glass substrate D and the glass substrate E is 0.7 mm.

Next, bond substrates bonded to respective SOI substrates are described. First, a silicon oxynitride film was formed to have a thickness of 50 nm over a single crystal silicon substrate by a plasma CVD method. In addition, a silicon nitride oxide film was formed thereover to have a thickness of 50 nm.

Next, the single crystal silicon substrate was irradiated with hydrogen through a surface of the silicon nitride oxide film by using an ion-doping apparatus. In this embodiment, irradiation with ionized hydrogen was performed to form an embrittlement layer in the single crystal silicon substrate. The ion doping was performed with an accelerating voltage of 35 kV at a dose of $2.2\times10^{16}$ ions/cm$^2$.

Next, a silicon oxide film was formed over the silicon nitride oxide film. The silicon oxide film was formed to have a thickness of 50 nm by a plasma CVD method using tetra-ethoxysilane (TEOS) (chemical formula: $Si(OC_2H_5)_4$) and an oxygen gas at a temperature of 300° C.

Then, each glass substrate and each bond substrate were subjected to treatment with ozone water and megasonic cleaning as surface treatment. After that, the glass substrates C, D and E are bonded to respective single crystal silicon substrates with the silicon oxide film interposed therebetween. Then, heat treatment was performed at 200° C. for 2 hours and then at 600° C. for 2 hours, whereby a crack was formed in the embrittlement layer to separate the single crystal silicon substrate from the glass substrate, and the bonding between the silicon oxide film and the glass substrate was strengthened. In this manner, the glass substrates C, D and E were manufactured.

Figure 18:
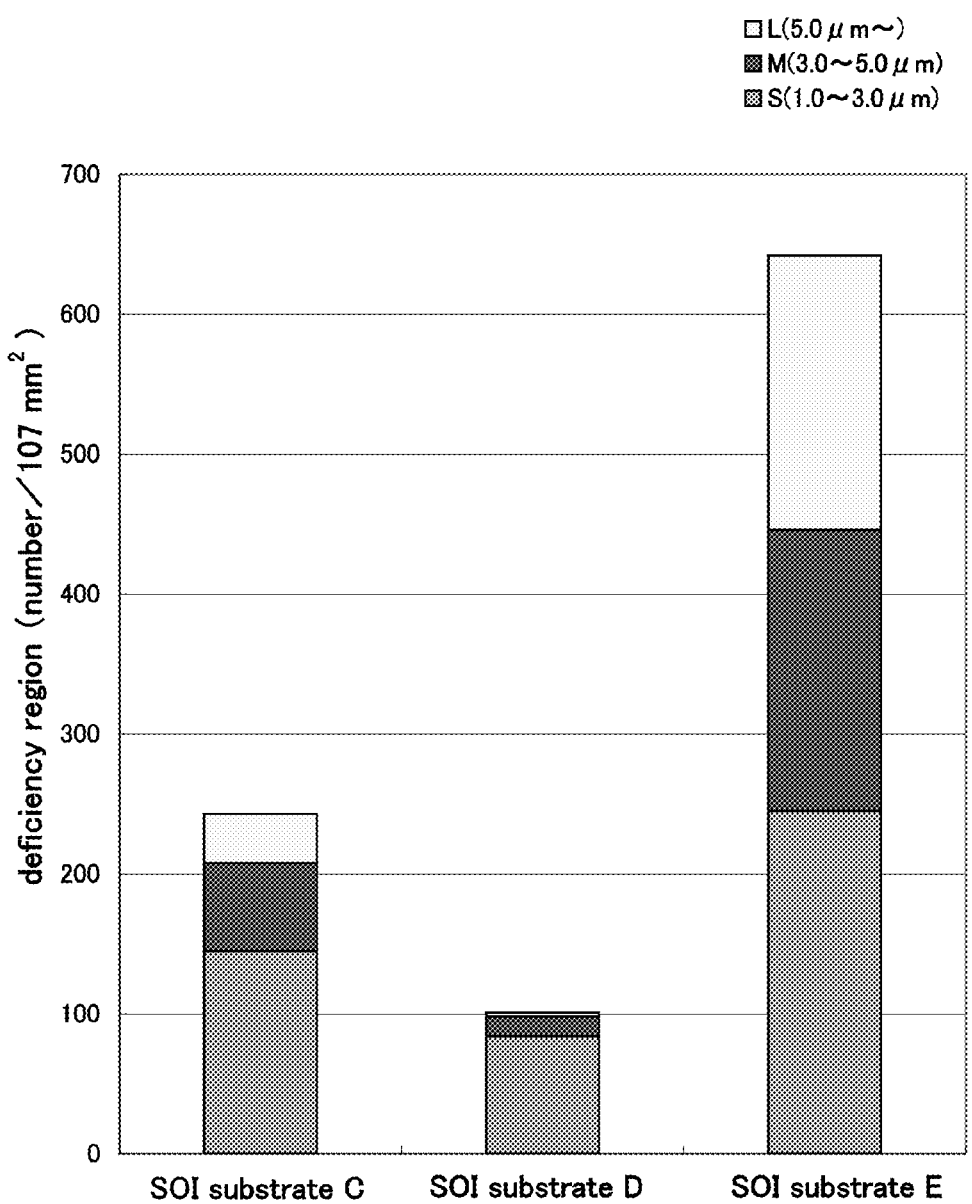
FIG. 18 is a graph of a deficiency region in a semiconductor layer of an SOI substrate according to an embodiment of the present invention.

Results obtained by detecting deficiency regions of the single crystal silicon film in each of the SOI substrates C, D and E are shown in FIG. 18. In FIG. 18, based on the length of the deficiency region in a direction in which scan with a laser beam is performed, deficiency regions in the SOI substrates are classified to S (longer than or equal to 1.0 μm and shorter than or equal to 3.0 μm), M (longer than or equal to 3.0 μm and shorter than or equal to 5.0 μm) and L (longer than or equal to 5.0 μm). Note that, as for the deficiency region, the length in a direction in which scan with a laser beam is performed is measured. It is found that, as compared to the SOI substrate E in which the untreated glass substrate is used, increase in the area and the number of deficiency regions is suppressed in the SOI substrate D in which the glass substrate subjected to HPM treatment is used. Further, as compared to the SOI substrate C, increase of the size and the number of deficiency regions is suppressed in the SOI substrate D in which the glass substrate subjected to ultrasonic treatment in addition to HPM treatment is used.

As described above, it was shown that formation of the altered layer on at least one surface of a glass substrate by HPM treatment suppressed increase of the area and the number of the deficiency regions of the single crystal silicon film in the SOI substrate. In addition, it was shown that increase of the area and the number of deficiency regions of a single crystal silicon film in an SOI substrate was further suppressed by adding ultrasonic treatment to HPM treatment.

This application is based on Japanese Patent Application serial no. 2008-178027 filed with Japan Patent Office on Jul. 8, 2008, the entire contents of which are hereby incorporated by reference.

What is claimed is:

1. A semiconductor device comprising:
   a substrate;
   a first insulating layer over and in contact with the substrate;
   a semiconductor layer over the first insulating layer;
   a gate insulating layer over the semiconductor layer; and
   a gate electrode over the gate insulating layer,
   wherein a thickness of the first insulating layer is greater than or equal to 5 nm and less than or equal to 3 μm, and
   wherein the first insulating layer has a higher silicon oxide proportion and a lower density than the substrate.

2. The semiconductor device according to claim 1, wherein the substrate is a glass substrate.

3. The semiconductor device according to claim 1, wherein concentrations of alkali metal and alkaline earth metal in the first insulating layer are lower than those in the substrate.

4. The semiconductor device according to claim 1, wherein the semiconductor layer is a single crystal semiconductor layer consisting essentially of silicon, germanium, silicon germanium, gallium arsenide, or indium phosphide.

5. The semiconductor device according to claim 1, further comprising:
   a second insulating layer between the first insulating layer and the semiconductor layer,
   wherein the second insulating layer is a single layer or a stacked layer selected from a group consisting of a silicon oxide film, a silicon nitride film, a silicon nitride oxide film, and/or a silicon oxynitride film.

6. The semiconductor device according to claim 1, wherein the semiconductor device is one of a computer, an RFCPU, a solar cell, a photo IC, and a semiconductor memory device.

7. A semiconductor device comprising:
   a substrate;
   a first insulating layer over the substrate;
   an intermediate layer between the substrate and the first insulating layer;
   a semiconductor layer over the first insulating layer;
   a gate insulating layer over the semiconductor layer; and
   a gate electrode over the gate insulating layer,
   wherein a thickness of the first insulating layer is greater than or equal to 5 nm and less than or equal to 3 μm,
   wherein the first insulating layer has a higher silicon oxide proportion and a lower density than the substrate, and
   wherein the intermediate layer has intermediate values of a silicon oxide proportion and a density between values of the substrate and the first insulating layer.

8. The semiconductor device according to claim 7, wherein the substrate is a glass substrate.

9. The semiconductor device according to claim 7, wherein concentrations of alkali metal and alkaline earth metal in the first insulating layer are lower than those in the substrate.

10. The semiconductor device according to claim 7, wherein the semiconductor layer is a single crystal semiconductor layer consisting essentially of silicon, germanium, silicon germanium, gallium arsenide, or indium phosphide.

11. The semiconductor device according to claim 7, further comprising:
    a second insulating layer between the first insulating layer and the semiconductor layer,
    wherein the second insulating layer is a single layer or a stacked layer selected from a group consisting of a silicon oxide film, a silicon nitride film, a silicon nitride oxide film, and/or a silicon oxynitride film.

12. The semiconductor device according to claim 7, wherein the semiconductor device is one of a computer, an RFCPU, a solar cell, a photo IC, and a semiconductor memory device.

* * * * *